United States Patent
Shor et al.

(10) Patent No.: US 9,252,821 B2
(45) Date of Patent: Feb. 2, 2016

(54) ADAPTIVE HIGH-ORDER NONLINEAR FUNCTION APPROXIMATION USING TIME-DOMAIN VOLTERRA SERIES TO PROVIDE FLEXIBLE HIGH PERFORMANCE DIGITAL PRE-DISTORTION

(71) Applicants: Roi M. Shor, Tel Aviv (IL); Avraham D. Gal, Ra'anana (IL); Peter Z. Rashev, Calgary (CA)

(72) Inventors: Roi M. Shor, Tel Aviv (IL); Avraham D. Gal, Ra'anana (IL); Peter Z. Rashev, Calgary (CA)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/318,000

(22) Filed: Jun. 27, 2014

(65) Prior Publication Data

US 2015/0381216 A1    Dec. 31, 2015

(51) Int. Cl.
*H04K 1/02*    (2006.01)
*H04L 25/03*    (2006.01)
*H04L 25/49*    (2006.01)
*H04B 1/04*    (2006.01)
*H04L 25/10*    (2006.01)

(52) U.S. Cl.
CPC .............. *H04B 1/0475* (2013.01); *H04L 25/10* (2013.01); *H04B 2001/045* (2013.01)

(58) Field of Classification Search
CPC ....... H03F 1/3247; H03F 3/24; H03F 1/3241; H04L 27/368; H03G 3/3042
USPC .................................................. 375/295–297
See application file for complete search history.

(56) References Cited

U.S. PATENT DOCUMENTS

| 7,796,960 B1 | 9/2010 | Rashev et al. |
| 2008/0130789 A1 | 6/2008 | Copeland et al. |

(Continued)

FOREIGN PATENT DOCUMENTS

WO    2013153485 A1    10/2013

OTHER PUBLICATIONS

A. Zhu et al., An Adaptive Volterra Predistorter for the Linearization of RF High Power Amplifiers, 2002 IEEE MTT-s Digest.

(Continued)

*Primary Examiner* — James M Perez
(74) *Attorney, Agent, or Firm* — Terrile, Cannatti, Chambers & Holland, LLP; Michael Rocco Cannatti

(57) ABSTRACT

A method and apparatus are used to predistort input signal samples according to Volterra Series Approximation Model using one or more digital predistortion blocks (300) having a plurality of predistorter cells (301-303), each including an input multiplication stage (366-367) for combining absolute sample values received from an absolute sample delay line (362) into a first stage output, a lookup table (368) connected to be addressed by the first stage output for generating an LUT output, and a plurality of output multiplication stages (371-372, 373-374) for combining the LUT output with samples received from the amplitude sample delay line (362) and signal sample delay line (363) to generate an output signal sample $y_Q$ from said predistorter cell, where the output signal samples $y_Q$ from the predistorter cells are combined at an output adder circuit (375) to generate one or more Volterra terms of a combined signal ($y_{OUT}[n]$).

20 Claims, 10 Drawing Sheets

(56) References Cited

U.S. PATENT DOCUMENTS

| | | | |
|---|---|---|---|
| 2010/0091830 A1* | 4/2010 | Li et al. | 375/231 |
| 2012/0098596 A1* | 4/2012 | Nagatani et al. | 330/149 |
| 2012/0119810 A1* | 5/2012 | Bai | 327/317 |
| 2012/0147993 A1 | 6/2012 | Kim et al. | |
| 2012/0229206 A1 | 9/2012 | van Zelm et al. | |
| 2013/0285742 A1 | 10/2013 | van Zelm et al. | |
| 2014/0009224 A1 | 1/2014 | van Zelm et al. | |
| 2014/0317163 A1* | 10/2014 | Azadet et al. | 708/420 |

OTHER PUBLICATIONS

H. Gandhi, A Flexible Volterra-Based Adaptive Digital Pre-Distortion SOlution for Wideband RF Power Amplifier Linearization, Microwaves & RF Magazine, 2008.

P. L. Gilabert et al., Multi-Lookup Table FPGA Implementation of an Adaptive Digital Predistorter for Linearizing RF Power Amplifiers with Memory Effects, IEEE Transactions on Microwave Theory and Techniques, vol. 56, No. 2, Feb. 2008.

* cited by examiner

ADAPTIVE HIGH-ORDER NONLINEAR FUNCTION APPROXIMATION USING TIME-DOMAIN VOLTERRA SERIES TO PROVIDE FLEXIBLE HIGH PERFORMANCE DIGITAL PRE-DISTORTION

BACKGROUND OF THE INVENTION

1. Field of the Invention

The present invention is directed in general to field of information processing. In one aspect, the present invention relates generally to digital predistortion for compensating an input signal for distortion introduced to the input signal by an electronic device.

2. Description of the Related Art

Wireless communication devices, such as mobile devices and base stations, typically include transmitter and receiver circuits (i.e., transceivers) in which power amplifiers are used to amplify a signal before wireless transmission to another device. However, some radio frequency (RF) power amplifiers generate out-of-band spurious emissions or otherwise add non-linear distortion to the amplified signal, where the distortion may include, for example, variations in phase differences and/or variations in amplitude differences. Significant distortion may result in poor signal quality. Traditional approaches for meeting the out-of-band spurious transmission requirements would operate the power amplifier well below its maximum output power, or require very expensive and inefficient power amplifiers which are designed according to the maximum peak power that they have to handle. In order to reduce the cost and improve efficiency of the power amplifier, digital pre-distortion (DPD) systems have been developed to compensate for the intrinsic distortion characteristics of non-linear power amplifier devices. A traditional DPD system determines an error signal which reflects differences between an input signal and a feedback signal from the system output, and then uses the error signal to determine a complementary distortion or inverse gain signal which is combined with the input signal to produce a pre-distorted signal that is input to the power amplifier device. In many cases, this process results in effective cancellation of the distortion (i.e., the non-linearities) produced within the system, and a more linear output signal may result. One approach for performing digital pre-distortion uses a polynomial model of the power amplifier that is evaluated to generate a pre-distortion function that is applied at the amplifier input to obtain a linear gain output. Other pre-distortion processes use one or more polynomials to adjust the input signal prior to amplification in order linearize the amplifier gain. In any case, the real-time processing requirements for evaluating a polynomial can impose significant complexity and processing costs in terms of the significant digital processing resources required to evaluate the polynomial.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
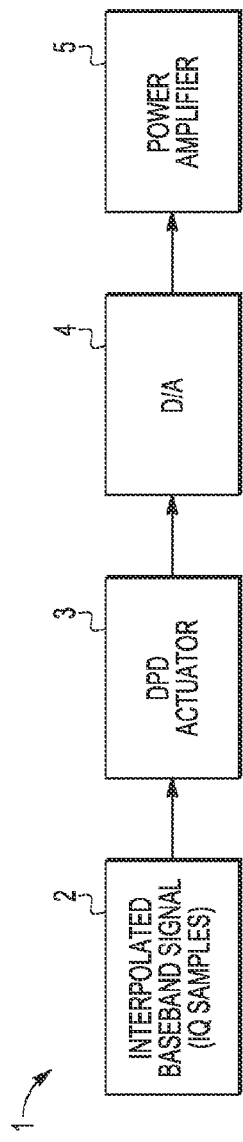
FIG. 1 is a simplified block diagram of a digital baseband predistortion communication system within a transmitter.

A system, apparatus, and methodology are described for evaluating a polynomial with a flexible high performance digital predistortion hardware which performs pre-correction processing on received baseband signal samples to overcome power amplifier non-linear operation (a.k.a. distortion). In selected embodiments, a single chip digital front end processor at a base station performs digital pre-distortion on a composite multi-carrier waveform using integrated predistorter hardware cells to evaluate Volterra series memory polynomial terms and higher order cross terms (e.g., type 1, 2 and 3) to model the inverse operation of power amplifiers (PA). For example, a scalable vector signal processor (VSP) may be optimized to perform digital pre-distortion (DPD) by including a plurality of predistorter cells to evaluate a complex polynomial $v[n]$ of order P against a complex input vector (e.g., $x[n]=(x_0, x_1, \ldots x_n)$) using Volterra's method. Each predistorter cell receives absolute sample values ($A[n]$) from a first delay line that holds the last K absolute values of the input complex samples ($x[n]$) and also receives complex sample values from a second delay line that holds the last K input complex samples ($x[n]$). In addition, each of Q identical predistorter cells includes an N-line look-up table (LUT)

which performs linear interpolation between LUT values to decrease quantization error. Using the product of one or more absolute sample values to index into the LUT, the resulting LUT outputs provide product terms (e.g., $\beta*A[n-k]$) which are multiplied with additional absolute sample values (e.g., $A[n-l]$) and/or complex sample values (e.g., $x[n-k]$) using a combination of multiplier and multiplexer hardware circuits so that the output of each cell may be combined at an adder circuit to generate the sum. For example, a pair of input multiplexers is used to multiply first and second absolute sample values at a first stage multiplier circuit, with the product being multiplexed at a first stage multiplexer along with an absolute sample value from one of the input multiplexers. The selected output from the first stage multiplexer is supplied as an index to the LUT with linear interpolation, and the resulting LUT output may be multiplied with another absolute sample value at a second stage multiplier. At a third stage multiplier, the selected output from the second stage multiplexer is multiplied with a complex sample value, and the resulting product is then multiplexed at an output multiplexer along with a "0" value to provide a first output term. With the "0" input selected, the BPC is disabled to save power. In this way, different output terms from different predistorter cells may be combined or added at a shared adder circuit. In addition, multiple BPCs can be cascaded in various ways to produce higher order Volterra terms of different cross-term structure. By computing power series terms using look-up tables, a high throughput, flexible and power efficient digital predistorter hardware implementation is provided which has a smaller device area, lower power consumption, and minimal or zero impact on DPD linearization performance. In selected embodiments, a single chip digital front end processor at abuse station performs digital pre-distortion on a composite multi-carrier waveform by using integrated predistorter hardware cells to perform Volterra's processing algorithm to calculate polynomial values from a complex input vector. However, it will be appreciated that the digital predistortion functionality provided is not constrained to a specific mathematical model, such as Volterra, since the LUT can represent any form of function, not only a power series model.

Applicants have determined that a need exists for improved digital pre-distortion (DPD) processing operations in wireless communication systems (such as 3G, 4G and future generations of systems) on the transmit side to overcome the problems in the art, such as outlined above, though further limitations and disadvantages of conventional technologies will become apparent to one of skill in the art after reviewing the remainder of the present application. For example, FIG. 1 is a simplified block diagram of a digital baseband predistortion communication transmitter 1 which processes received interpolated samples 2 at a digital predistortion actuator 3 for RF conversion at the digital-to-analog converter 4 and power amplification at RF power amplifier (PA) 5 for transmission by a corresponding antenna (not shown). While there are DPD actuator solutions which use algorithms based on Volterra modeling of the inverse operation of power amplifier, such solutions are typically quite complex, and utilize software-based actuators or hardware-based actuators which provide only limited support for computing memory polynomial terms and basic cross terms from the Volterra series approximation of non-linear functions while requiring a significant amount of computational resources. In this disclosure, Applicants have provided an improved system, apparatus, and method for evaluating a polynomial against a one or more complex input vectors to allow flexible support for advanced DPD actuators by cascading DPD actuator hardware cells to support computation of Volterra series memory polynomial terms and cross terms of type 1, 2 and 3 based on look-up table (LUT) implementation in single memory to address various problems in the art where various limitations and disadvantages of conventional solutions and technologies will become apparent to one of skill in the art after reviewing the remainder of the present application with reference to the drawings and detailed description which follow. Some of these advantages include scalability of performance, improved versatility, and/or simplified implementation. Scalability is enabled by the way that each SoC can decide the number of required BPCs based on performance requirements. Versatility is provided while fully re-using a re-configured version of the existing hardware by re-arranging the interconnections among the BPCs. A common, small, and efficient BPC building block can not only be readily re-used, but also the advantage of simpler verification/validation, and overall effort of implementation.

Figure 2:
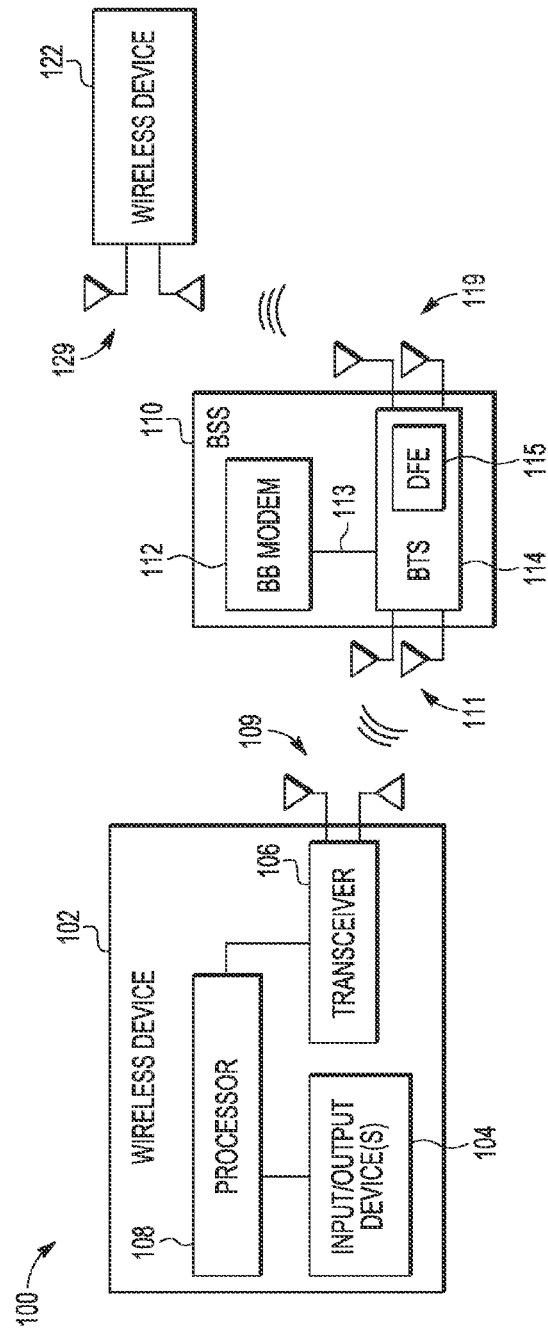
FIG. 2 is a simplified block diagram of a wireless communication system with a base station system deployed with a plurality of radio base station subsystems in accordance with selected embodiments of the present disclosure.

Turning now to FIG. 2, there is shown a simplified block diagram of a wireless communication system 100 having digital front end (DFE) modules at one or more multi-antenna system nodes for performing digital pre-distortion on transmit signals prior to power amplification. The depicted wireless communication system 100 includes a plurality of wireless devices or subscriber stations 102, 122 (e.g., hand-held computers, personal digital assistants (PDAs), cellular telephones, etc.) that wirelessly communicate with one or more base station systems (BSS) 110 (e.g., enhanced Node-B or eNB devices). Each wireless devices (e.g., 102) may include a processor 108 (e.g., a digital signal processor), a transceiver 106 connected to one or more antennas 109, and one or more input/output devices 104 (e.g., a camera, a keypad, display, etc.), along with other components (not shown). The wireless devices 102, 122 use attached antennas 109, 129 to wirelessly communicate with the base station system (BSS) 110 via antennas 111, 119 to receive or transmit voice, data, or both voice and data.

In the depicted arrangement, the base station system 110 is deployed with a plurality of radio base station subsystems or nodes, including a baseband modem 112 (e.g., radio equipment control device) and at least one base transceiver station (BTS) 114 connected to one or more antennas 111, 119 to function as a radio equipment device. In the illustrated topology, the baseband modem 112 is connected over a network link 113 (e.g., CPRI link) to a first BTS 114.

In the embodiments shown, the base transceiver station 114 includes a digital front end (DFE) processor 115 which may be implemented as a single integrated circuit to provide the digital components of the cellular base station RF subsystem. The digital components consolidated on each DFE 115 may include one or more control processors and digital transmit/receive filters, as well as interface peripherals and other I/O for RF subsystem functions. In addition and as described more fully below, each DFE 115 may include a transmit processing path for each antenna which performs signal processing on the transmit signal, including digital pre-distortion processing. The DPD-processed transmit signal is then provided to a power amplifier and associated antenna, thereby forming a separate DFE-power amplifier chain for each transmit antenna. As will be appreciated, the DPD processing techniques disclosed herein with reference to the base station system 110 may also be used in connection with a multi-antenna wireless communication device, such as the wireless devices 102, 122. To this end, each wireless device 102, 122 may also include a digital front end (DFE) processor or equivalent circuitry connected to a corresponding transceiver unit which includes a transmit processing path for each antenna which performs signal processing on the transmit signal.

Figure 3:
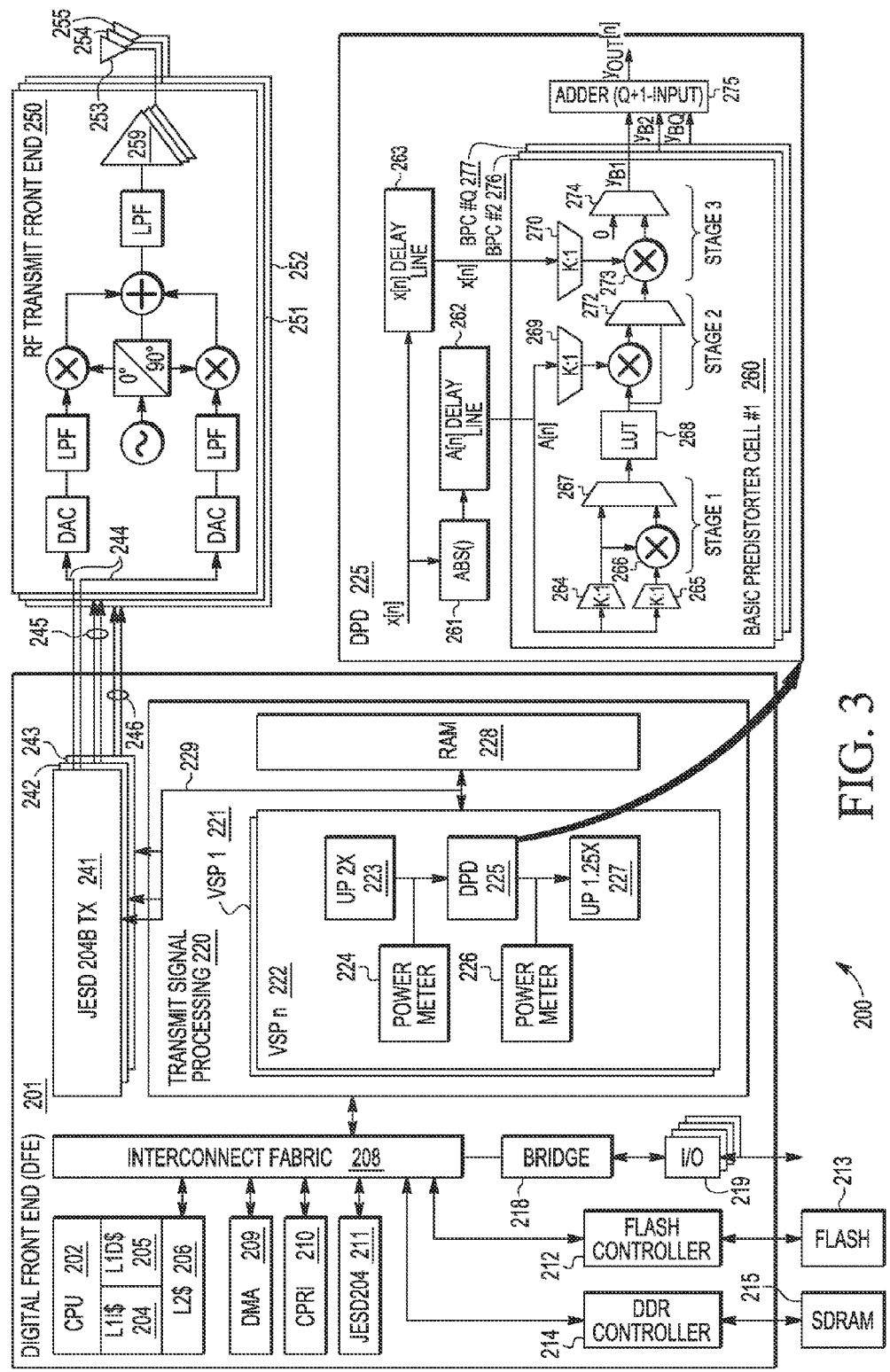
FIG. 3 is a block diagram illustration of a base station system having a multi-antenna radio frequency (RF) subsystem with a single chip digital front end (DFE) processor having integrated digital predistorter hardware cells to evaluate higher order Volterra terms in accordance with selected embodiments of the present disclosure.

To illustrate selected digital pre-distortion processing applications of the integrated digital predistortion hardware disclosed herein, reference is now made to FIG. 3 which depicts a high level architecture block diagram illustration of a multi-antenna radio frequency (RF) base station subsystem 200 which performs pre-distortion using a plurality of LUT-based basic predistortion hardware cells to efficiently evaluate Volterra series memory polynomial terms and higher order cross terms (e.g., type 1, 2 and 3) from the same input vector. The RF base station subsystem 200 is connected to a base station controller (not shown), and includes a single chip digital front end (DFE) processor 201 connected over one or more RF transmit front end circuits 250-252 to one or more antennas 253-255, respectively. As will be appreciated, a radio receiver front end may be understood to refer to all circuitry between the antenna and the first intermediate frequency (IF) stage, including analog and digital receiver components that process the signal at the original incoming radio frequency (RF) before it is converted to an intermediate frequency (IF). In this arrangement, the digital front end (DFE) processor 201 may be located in a radio head that is co-located with the base station controller, or may be located at a remote radio head that is not co-located with the base station controller. For simplicity of illustration, the transmit antennas 253-255 are shown as being connected to the respective transmit front end circuits 250-252, but it will be appreciated that the transmit antennas 253-255 may be shared for both signal transmission and reception in a shared or switched circuit arrangement.

Connected to each transmit antenna (e.g., 253) is an RF transmit front end circuit (e.g., 250) which includes RF conversion circuit components (e.g., digital-to-analog converters, low pass filters, oscillators, splitters, mixers, amplifiers, etc.) for converting and filtering the digital I and Q samples 244 output by the DFE processor 201 to a combined analog signal that is filtered and amplified (e.g., with one or more RF power amplifiers 259) for transmission by a corresponding antenna (e.g., 253). In similar fashion, each receive antenna may be connected to an RF receive front end circuit (not shown) which includes RF conversion circuit components (e.g., bandpass filters, splitters, low pass filters, oscillators, mixers, amplifiers, analog-to-digital converters, etc.) that process the signal from the antenna received at the original incoming radio frequency (RF) and convert it for processing by the DFE processor 201. Though the RF front end circuits (e.g., 250) employ the depicted RF conversion and power amplifier circuit components, it will be appreciated that other RF conversion circuit arrangements and power amplifier components can be used.

The digital front end (DFE) processor 201 is provided to perform digital signal processing for the RF base station subsystem 200 across the separate transmit antennas 253-255. To this end, the DFE processor 201 partitions transmit signals to the antennas into transmit processing paths, and communicates with the baseband modem through the Common Public Radio Interface (CPRI) interface 210, JESD204A/B interface 211, and/or other protocol. The DFE processor 201 may include one or more control processors 202 (e.g., one or more processor cores), memory subsystems (e.g., L1 instruction cache 204, L1 data cache 205, L2 cache 206), memory controllers (e.g., DMA controller 209, flash controller 212, and DDR controller 214) for interfacing with external memory (e.g., Flash memory 213, SDRAM 215), one or more modem interfaces (e.g., CPRI interface 210 and JESD204A/B interface 211), and I/0 facilities (e.g., host bridge 218) for I/O devices 219. As a general matter, any of a variety of memory designs and hierarchies may be employed in, or in conjunction with, with the DFE processor 201. Also, it will be appreciated that the I/O devices 219 may include any desired I/O device, such as Ethernet, I2C, SPI, GPIO, and/or UART devices. All processor subsystems are linked by a multi-level interconnect fabric 208.

To digitally process transmit signals, the DFE processor 201 may also include a programmable transmit signal processing path for each transmit antenna 253-255 which is formed with a transmit signal processor 220 and an associated serialized interface 241-243 (e.g., a JESD204B TX interface) and RF transmit front end 250-252. The transmit signal processor 220 may include one or more processors 221-222 (e.g., vector signal processors VSP1 and VSPn) and associated memory 228 (e.g., RAM) for performing carrier-related signal processing and antenna-specific processing on IQ samples received from the baseband modem. Signal processing along each transmit signal path may be divided between the processors 221-222 and shared memory 228. For example, a first vector signal processor 221 (VSP 1) may be used to scale, filter, interpolate, up-sample, and combine multiple carriers into a composite carrier, and then perform crest factor reduction (CFR) on the composite carrier. After crest factor reduction, the CFR-processed signal may be transferred to the shared RAM 228. At this point, a second vector signal processor 222 (VSP n) may be used to perform dynamic pre-distortion, interpolation, and/or other signal processing on the output IQ samples retrieved from shared memory 228. For example, retrieved IQ samples from shared RAM 228 are stored in an internal VSP buffer (not shown), up-sampled by interpolator 223 (e.g., by 2X), measured with a first power meter 224, processed through the DPD module 225, measured with a second power meter 226, and then up-sampled by interpolator 227 (e.g., by 1.25X) to a final sample rate for storage in the internal VSP buffer (not shown). The power meters 224, 226 are used to monitor the power profile of the transmit signal. Once signal processing is completed, the transmit signal processor 220 may send the processed samples over a signal/buss line 229 to an associated serialized interface (e.g., JESD204B TX 241) for transfer to the transceiver (e.g., 250) over IQ signal lines 244. In this way, a first antenna path is formed by the connection of the transmit signal processor 220 and JESD204B TX interface 241 which are connected over IQ signal lines 244 to transceiver 250 and antenna 253, a second antenna path is formed by the connection of the transmit signal processor 220 and JESD204B TX interface 242 which are connected over IQ signal lines 245 to transceiver 251 and antenna 254, and a third antenna path is formed by the connection of the transmit signal processor 220 and JESD204B TX interface 243 which are connected over IQ signal lines 246 to transceiver 252 and antenna 255.

With each transmit signal path between the DFE processor 201 and antennas 253-255, the output signal (e.g., 244) provided to the RF transmit front end (e.g., 250) is amplified by RF power amplifier circuitry (e.g., 259) which can generate out-of-band spurious emissions or otherwise add non-linear distortion to the amplified signal. To maintain linear operation and prevent or reduce distortion, digital pre-distortion (DPD) systems are used to compensate for the intrinsic distortion characteristics of non-linear power amplifier devices. Pre-distortion in the baseband domain is performed by creating a function 'G' that acts upon the signal x[n] prior to power amplification that has transfer function 'H', so when the pre-distorted version of x[n], called y[n], is inserted to the power amplifier, the overall power amplifier output is linear (or at least, less non-linear). There are a variety of techniques for generating the predistortion function, such as using mathematical models to represent the power amplifier and computing an inverse of the model or using curve-fitting methods (e.g., Secant, Newton's Discrete method, and the like) to adapt the function 'G' such that $H*y[n]=\sim g*x[n]$, where g is the amplifier gain. However, there is a significant processing complexity and other costs associated with implementing such DPD algorithms, such as the substantial digital processing required to evaluate the complex polynomial models of the power amplifier.

Figure 4:
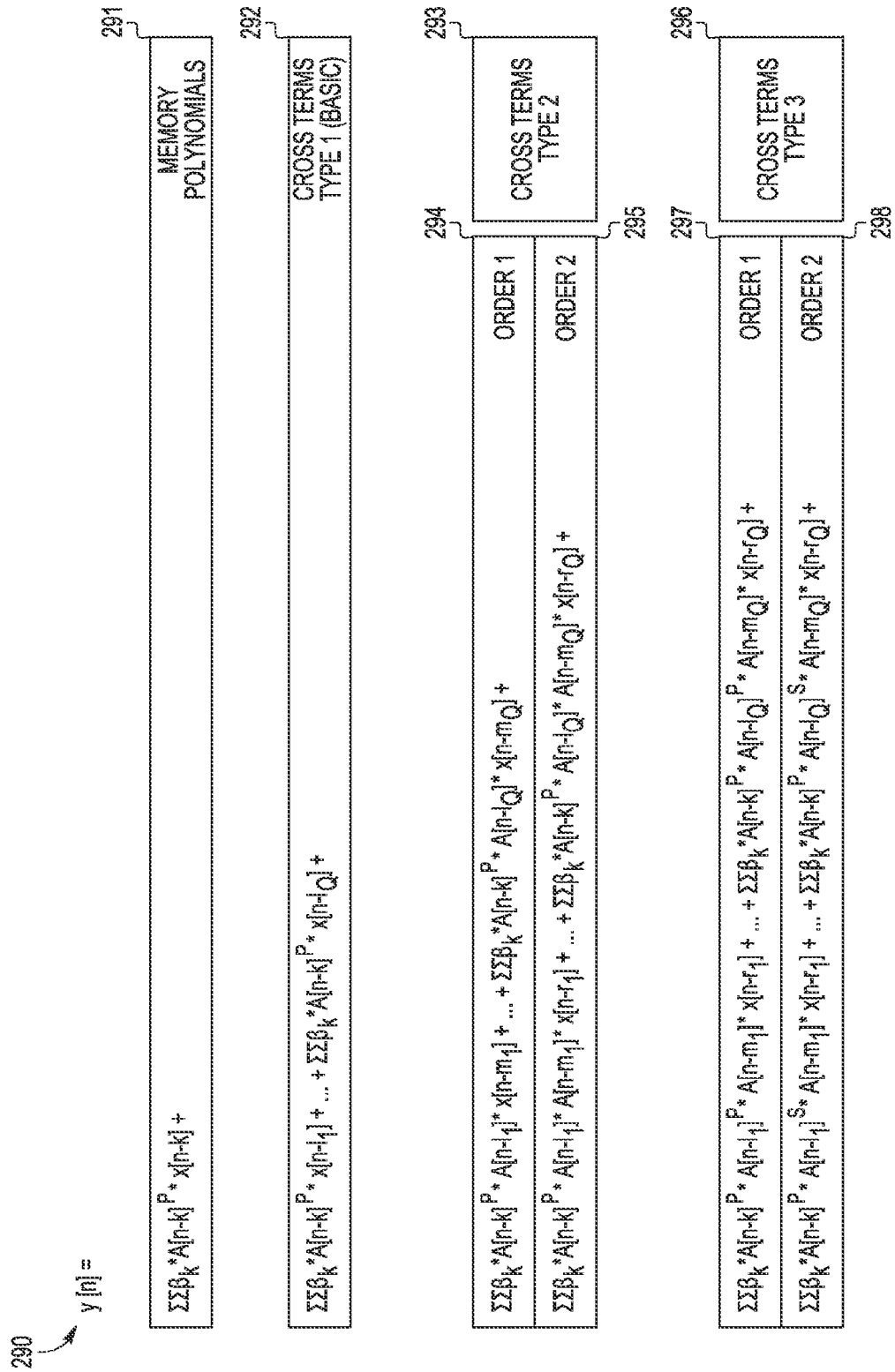
FIG. 4 illustrates the equation for a generic Volterra series approximation model.

For example, FIG. 4 illustrates a Generic Volterra Series Approximation (GVSA) model of a power amplifier with a complex polynomial defined by a set of complex polynomial filtering coefficients $\{\beta_k, k=[0:K-1]\}$ in a functional power series of the equation 290 in which y[n] is computed as the sum of the memory polynomial terms 291, type 1 cross terms 292, type 2 cross terms 293, and type 3 cross terms 296. The order of the term—such as $1^{st}$ order, $2^{nd}$ order, etc.—refers to the dynamicity of the model, and determines the number of terms (in addition to the main term) that take part in any cross-correlation computation between samples from more than one time point to account for memory effects. In the example shown in FIG. 4, y[n] is computed as the sum of the memory polynomial terms 291 (e.g., $\Sigma\Sigma\beta_k*A[n-k]^P*x[n-k]$), type 1 cross terms 292 (e.g., $\Sigma\Sigma\beta_k*A[n-k]^P$ $x[n-l_1]+\ldots+\Sigma\Sigma\beta k*A[n-k]^P*x[n-1_Q]$), first order type 2 cross terms 294 ($\Sigma\Sigma\beta_k*A[n-k]^P*A[n-l_1]x[n-m_1]+\ldots+\Sigma\Sigma\beta k*A[n-k]^P*A[n-1_Q]*x[n-m_Q]$), second order type 2 cross terms 295 ($\Sigma\Sigma\beta_k*A[n-k]^P*A[n-l_1]*A[n-m_1]*x[n-r_1]+\ldots+\Sigma\Sigma\beta k*A[n-k]^P*A[n-1_Q]*A[n-m_Q]*x[n-r_Q]$), first order type 3 cross terms 297 ($\Sigma\Sigma\beta k*A[n-k]^P*A[n-l_1]*A[n-m_1]^P*A[n-m_1]*x[n-r_1]+\ldots+\Sigma\Sigma\beta k*A[n-k]^P*A[n-1_Q]^P*A[n-m_Q]*x[n-r_Q]$), and second order type 3 cross terms 298 ($\Sigma\Sigma\beta_k*A[n-k]^P*A[n-l_1]^S*A[n-m_1]*x[n-r_1]+\ldots+\Sigma\Sigma\beta k*A[n-k]^P*A[n-1_Q]^S*A[n-m_Q]*x[n-r_Q]$). In the example Volterra power series equation 290, v[n] is the DPD output (IQ complex sample) and x[n] is the DPD input (IQ complex sample). In addition, A[n] is the real-valued amplitude of the DPD input (e.g., abs(x[n]), $\beta_k$ is the coefficient of the filtering, and P is the order of the polynomial degree. The double integral function $\Sigma\Sigma$ runs over k=[0:K-1], p=[0:P-1] and/or s=[0:S-1]. In addition, the terms $l_q$, $m_q$, $r_q$ are constant delays for each predistorter hardware cells 260, 276, 277 (total number of offsets=Q).

As will be appreciated, computation of the power series terms y[n], such as the Volterra power series equation 290, can be done either directly or using lookup-tables. With direct implementation, the DPD function would require a large number of multiplications to construct the nonlinear and memory terms, and this number increases significantly with K, P, S and Q. As a result, existing DPD solutions have embodied only partial computations of the Volterra power series equation 290, generating only the memory polynomial terms and basic type 1 cross terms. In contrast, lookup-tables implementations are much more efficient (e.g., 5× more efficient) in device area, resulting in reduced power consumption with minimal or no impact on DPD linearization performance.

In accordance with selected embodiments of the present disclosure, the DPD module 225 is provided for efficiently evaluating a complex polynomial 290 by providing the DPD module 225 with a plurality of basic predistorter hardware cells 260, 276, 277 for generating q different Volterra terms (e.g., $y_{B1}, y_{B2}, \ldots y_{BQ}$) of a complex polynomial of order P based on N complex input values (e.g., $x[n]=(x_0, x_1, \ldots x_N)$).

The main components of the depicted DPD module 225 include a first vector magnitude computation unit 261, a first delay line 262 for holding K-1:0 absolute samples, a second delay line 263 for holding K-1:0 complex samples, and a plurality of basic predistorter hardware cells 260, 276, 277. The first vector magnitude computation unit 261 computes, generates or retrieves the absolute value or vector magnitude ABS() for the input data samples x[n]. The first delay line 262 holds the last M (e.g., M=32) absolute values of the input complex samples x[n] received from the first vector magnitude computation unit 261. The second delay line 263 holds the last M (e.g., M=32) input complex samples x[n]. The plurality of basic predistorter hardware cells may be embodied as Q (e.g., Q=8) identical basic predistorter hardware cell units, where each basic predistorter hardware cell (e.g., 260) includes a multi-stage multiply and accumulate hardware or firmware structure including a pair of input multiplexers 264, 265, a first stage multiplier 266 and multiplexer 267, a look-up table 268, a second stage multiplier 271 and multiplexer 272 with an absolute value input multiplexer 269, and a third stage multiplier 273 and multiplexer 274 with a complex absolute value input multiplexer 270. The different Volterra terms are accumulated at an adder circuit 275 to generate a complex polynomial at the DPD output (e.g., $y[n]=y_{B1}+y_{B2}+\ldots y_{BQ}$).

In operation, each basic predistorter hardware cell (e.g., BPC 260) receives absolute sample values (A[n]) from a first delay line 262 that holds the last M absolute values of the input complex samples (x[n]) and also receives complex sample values from the second delay line that holds the last M input complex samples (x[n]). In addition, each of Q identical predistorter hardware cells includes an N-line look-up table (LUT) 268 which performs linear interpolation between LUT values to decrease quantization error. Using the product of one or more absolute sample values to index into the LUT 268, the resulting LUT outputs provide product terms (e.g., $\beta*A[n-k]$) which are multiplied with additional absolute sample values (e.g., A[n-l]) and/or complex sample values (e.g., x[n-k]) using a combination of multiplier and multiplexer hardware circuits so that the output of each predistorter hardware cell may be combined at an adder circuit 275 to generate the DPD output sum (e.g., y[n]).

In the depicted DPD module 225, a pair of K- input multiplexers 264, 265 (e.g., K=32:1 MUXes) provides first and second absolute sample values obtained from the first delay line 252 for multiplication at a first stage (STAGE 1) multiplier circuit 266 which performs a real number multiplication operation. The resulting product output from the first stage multiplier circuit 266 is connected to a first stage multiplexer 267 which also receives an absolute sample value from one of the input multiplexers (e.g., 264) which bypasses the multiplier circuit 266. The selected output from the first stage multiplexer 267 is supplied as an index to the LUT 268. In an example embodiment, the LUT 268 stores 128×4=512 entries with linear interpolation. In addition, the LUT 268 may provide linear interpolation between LUT values to reduce quantization error. The output from the LUT 268 is connected to a second stage (STAGE 2) multiplier circuit 271 which also receives an absolute sample value input obtained from the absolute value K- input multiplexer 269 (e.g., K=32:1 MUX). In this configuration, the second stage multiplier circuit 271 performs a half complex multiplication operation. The resulting product output from the second stage multiplier circuit 271 is connected to a second stage multiplexer 272 which also receives an output from the LUT 268 which bypasses the multiplier circuit 271. At a third stage (STAGE 3) multiplier circuit 273, the selected output from the second stage multiplexer 272 is multiplied with a complex sample value obtained from the complex absolute value K-input multiplexer 270 (e.g., K=32:1 MUX). In this configuration, the third stage multiplier circuit 273 performs a complex multiplication operation, and the output from the third stage multiplier circuit 273 is connected to a third stage (STAGE 3) multiplexer 274 which also receives an empty term or "0" input. The third stage multiplexer 274 is connected to select between the empty term and the complex multiplication output from the third stage multiplier circuit 273 for output as a first output term (e.g., $y_{B1}$) from the basic predistorter hardware cell (e.g., BPC 260). In this way, different output terms (e.g., $y_{B1}, y_{B2} \ldots y_{BQ}$) from different predistorter cells (e.g., 260, 276, 277) may be combined or added at the shared adder circuit 275 to generate the DPD output (e.g., $y[n]=y_{B1}+y_{B2}, +\ldots y_{BQ}$). For example, each of the basic predistorter hardware cells 260, 276, 277 is capable of implementing one of the following GVSA memory polynomials or first order cross terms for types 1, 2 and 3:

a. $y[n]=\Sigma\beta*A[n]^P$ (Static polynomial term)
b. $y[n]=\Sigma\beta*A[n-k]^P$ (a single memory polynomial term)
c. $y[n]=\Sigma\beta*A[n-k]^P*A[n-l]$ (a single memory $1^{st}$ order Volterra model term)
d. $y[n]=\Sigma\beta*A[n-k]^P*A[n-l]*A[n-m]$ (a single memory $2^{nd}$ order Volterra model term)
e. $y[n]=\Sigma\beta*A[n-k]^P*A[n-l]^P*A[n-m]*A[n-r]$ (a single memory $3^{rd}$ order Volterra model term)

where l, m, and r are constant delays.

In selected embodiments, the single chip digital front end processor 201 performs digital pre-distortion on a composite multi-carrier waveform by using the integrated predistorter hardware cells 260, 276, 277 to perform Volterra's processing algorithm to calculate polynomial values from a complex input vector. However, it will be appreciated that the digital predistortion functionality provided is not constrained to a specific mathematical model, such as Volterra, since the LUT can represent any form of function, not only a power series model. For example, the depicted DPD module 225 may be used to implement any other LUT-based function, with or without cross-correlation term multiplication, allowing for direct adaptation solutions for generating the predistortion function 'G' using curve-fitting methods, such as Secant, Newton's Discrete method, and the like. By implementing direct adaptation methods with look-up tables, the DPD module 225 is not constrained to a specific mathematical model, such as Volterra, since the LUT 268 can represent any form of function, not only a power series model. Also, the ability of the DPD module 225 to provide a more elaborate mathematical DPD model with more power series terms reduces the complexity of direct adaptation solutions, as compared to traditional curve-fitting methods.

Figure 5:
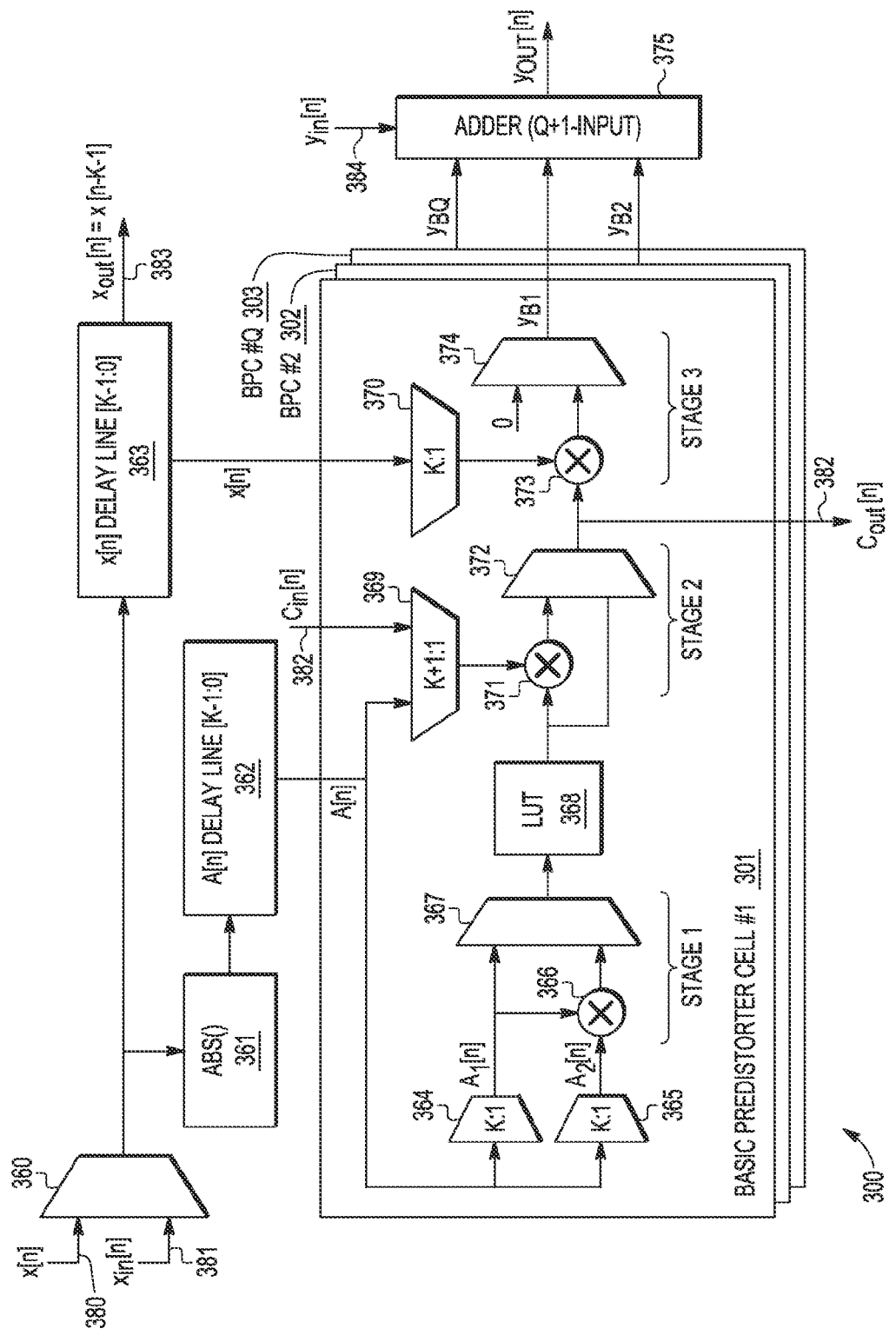
FIG. 5 is a simplified block diagram illustration of digital predistorter hardware cells with additional input/output ports to evaluate higher order Volterra terms in accordance with selected embodiments of the present disclosure.

In order to generate higher order Volterra terms, selected embodiments of the present disclosure provide for the interconnection of different predistorter hardware cells into a cascaded arrangement by including additional input and output ports at each predistorter hardware cell. For example, reference is now made to FIG. 5 which depicts a simplified block diagram illustration of a digital predistorter module 300 with additional input/output ports $x_{in}[n]$, $C_{in}[n]$, $C_{out}[n]$, $x_{out}[n]$, $y_{in}[n]$ which may be used to cascade multiple predistorter hardware cells to evaluate higher order Volterra terms in accordance with selected embodiments of the present disclosure. Connected in essentially the same arrangement as the DPD module 225 shown in FIG. 3, the digital predistorter module 300 may be embodied with a first vector magnitude computation unit 361, a first delay line 362, a second delay line 363, a plurality Q (e.g., Q=8) identical basic predistorter hardware cell units 301, 302, 303, and a shared output adder circuit 375 connected as shown. In each basic predistorter hardware cell (e.g., 301), there is connected a multi-stage multiply and accumulate hardware or firmware structure including a pair of K-input multiplexers 364, 365, a first stage multiplier 366 and multiplexer 367, an N-line look-up table (LUT) 368, a second stage multiplier 371 and multiplexer 372 with an absolute value K+1 input multiplexer 369, and a third stage multiplier 373 and multiplexer 374 with a complex absolute value K-input multiplexer 370. However, the digital predistorter module 300 also includes additional circuitry and connection ports for conveying inputs and/or outputs to or from other basic predistorter hardware cell units 301, 302, 303. The additional circuitry includes a K-input multiplexer 360 which receives and selects between a first input complex sample 380 ($x[n]$) and a second complex sample 381 ($x_{in}[n]$) for output to the first vector magnitude computation unit 361 and second delay line 363. In addition, the absolute value K+1 input multiplexer 369 is provided with an input port 382 for receiving an input term $C_{in}[n]$, such a second stage (STAGE 2) output from another basic predistorter hardware cell unit. In addition, a second stage output connection line or port 382 may be provided at the output of the second stage multiplexer 372 for providing an output term $C_{out}[n]$ for possible input to another basic predistorter hardware cell unit. The second delay line 363 may also include an output connection line or port 383 for providing an output term $x_{out}[n]=x[n-K-1]$ for possible input to another basic predistorter hardware cell unit. Likewise, the shared output adder circuit 375 may be implemented as a Q+1 input adder which includes an input connection line or port 384 for receiving an input term $y_{in}[n]$, such as an output term from another basic predistorter hardware cell unit.

In the depicted DPD module 300, the K-input multiplexer 360 chooses between the first and second first input complex samples $x[n]$, $x_{in}[n]$) for input to the first vector magnitude computation unit 361 and second delay line 363. From the first delay line 362, first and second absolute sample values (e.g., $A_1[n], A_2[n]$) provided by the K-input multiplexers 364, 365 are processed at the first stage (STAGE 1) multiplier circuit 366 and multiplexer 367 to generate index inputs to the interpolation LUT 368. At the second stage (STAGE 2), the second stage multiplier circuit 371 multiplies the output from the LUT 268 and the input provided by the K+1 input multiplexer 369 which chooses between the absolute sample value input $A[n]$ and the input term $C_{in}[n]$ received at the input port 382. The resulting product output from the second stage multiplier circuit 371 and a bypass output from the LUT 368 are connected to the second stage multiplexer 372 which generates an output term $C_{out}[n]$ at the second stage output connection line or port 382. This same output term $C_{out}[n]$ is multiplied at the third stage (STAGE 3) multiplier circuit 373 with a complex sample value obtained from the complex absolute value K-input multiplexer 370. The output from the third stage multiplier circuit 373 is connected as an input to the third stage (STAGE 3) multiplexer 374 which also receives the empty term or "0" input. As a result, the third stage multiplexer 374 chooses between the empty term and the complex multiplication output from the third stage multiplier circuit 373 for output as a first output term (e.g., $y_{B1}$) from the basic predistorter hardware cell (e.g., BPC 301). In this way, different output terms (e.g., $y_{B1}, y_{B2} \ldots y_{BQ}$) from different predistorter cells (e.g., 301-303) may be combined or added at the shared adder circuit 375 which also receives the input term $y_{in}[n]$ from the input connection line or port 384. The resulting output from the shared adder circuit 375 is the DPD output (e.g., $y[n]=y_{in}[n]+y_{B1}+y_{B2}, +\ldots y_{BQ}$).

Figure 6:
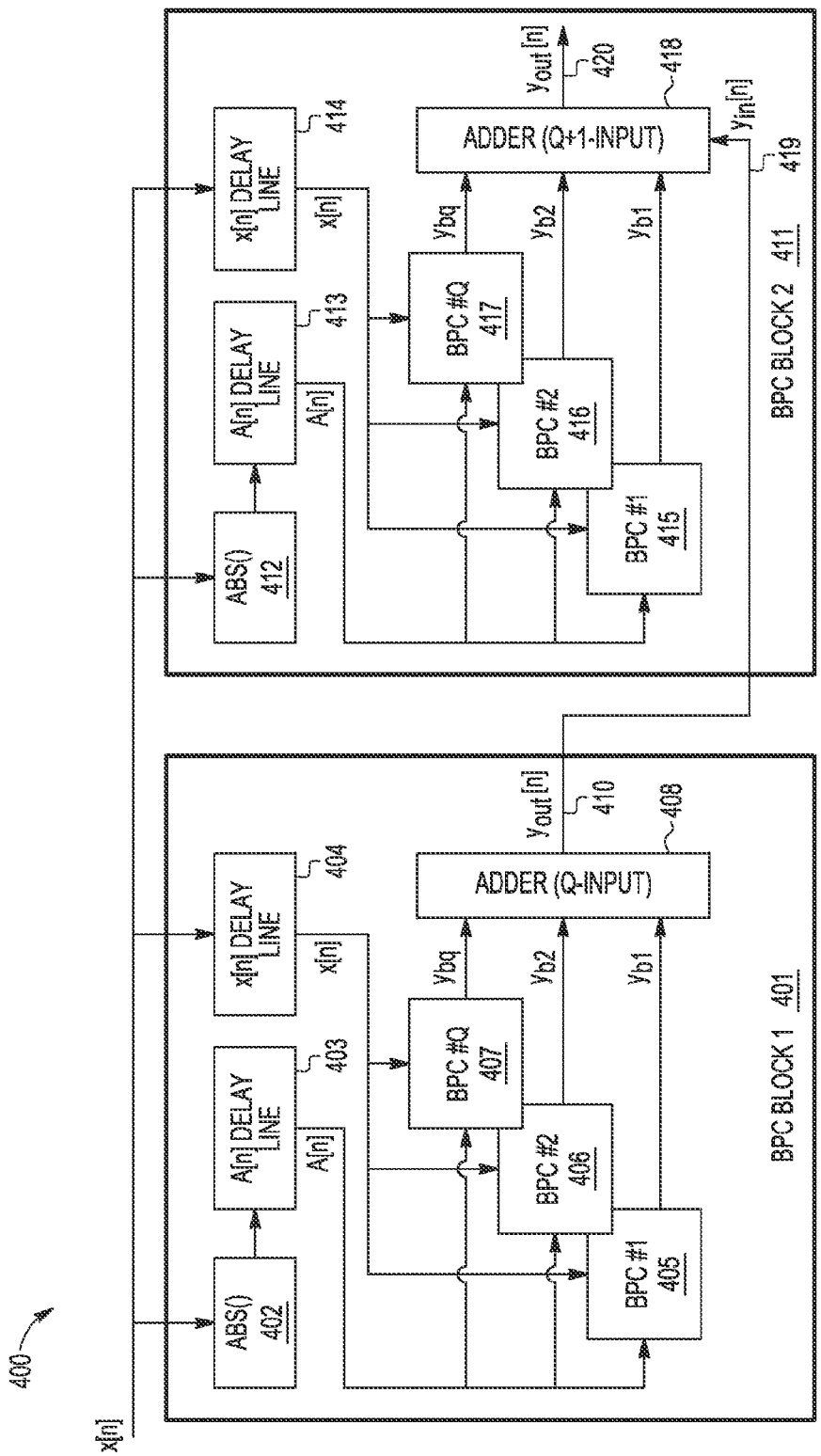
FIG. 6 is a simplified block diagram illustration of two digital predistorter hardware cells which are cascaded by adder expansion to evaluate higher order Volterra terms in accordance with selected embodiments of the present disclosure.

With the multi-port DPD module 300, it will be appreciated that a single basic predistorter hardware cell unit can be configured to compute the first order cross term type 1, $\Sigma \beta_k * X[n-k]^P * X[n-m_1] * x[n-r_1]$. However, by cascading two basic predistorter hardware cell units using the additional input/output ports $x_{in}[n]$, $C_{in}[n]$, $C_{out}[n]$, $x_{out}[n]$, $y_{in}[n]$, higher order Volterra terms may be evaluated in accordance with selected embodiments of the present disclosure. For example, reference is now made to FIG. 6 which shows a simplified block diagram illustration of a cascaded circuit 400 having two digital basic predistorter cell (BPC) blocks 401, 411 which are connected to receive the same input complex sample x[n], where the BPC blocks 401, 411 include adder circuits 408, 418 connected in an adder expansion configuration so that an output term $y_{out}[n]$ from the adder circuit 408 is provided as an input $y_{in}[n]$ to the Q+1 adder circuit 418. Connected in essentially the same arrangement as the DPD module 225 shown in FIG. 3, each BPC block 401, 411 includes a first vector magnitude computation unit 402, 412, a first delay line 403, 413, a second delay line 404, 414, a plurality Q identical basic predistorter cells 405-407, 415-417, and a shared output adder circuit 408, 418 connected as shown. Though not shown, each basic predistorter cell (BPC) is configured as a multi-stage multiply and accumulate hardware or firmware structure including a pair of K-input multiplexers, a first stage multiplier and multiplexer, an N-line look-up table (LUT), a second stage multiplier and multiplexer with an absolute value input multiplexer, and a third stage multiplier and multiplexer with a complex absolute value K-input multiplexer, substantially as disclosed in FIG. 3. In addition, each BPC block 401, 411 also includes additional circuitry and connection ports for conveying inputs and/or outputs to or from other BPC blocks. In particular, the first BPC block 401 includes a shared Q-input adder circuit 408 having an output 410 that provides an output term $y_{out}[n]$ directly to the input connection line or port 419 at the shared Q+1 adder circuit 418 of the second BPC block 411. With the configuration of the depicted cascaded circuit 400, it will be appreciated that the shared Q-input adder circuits 408, 418 may both be implemented as Q+1 adder circuits if desired. In any case, the resulting output 420 $y_{out}[n]$ from the BPC block 411 doubles the number of Volterra terms with time span defined by delay lines.

Figure 7:
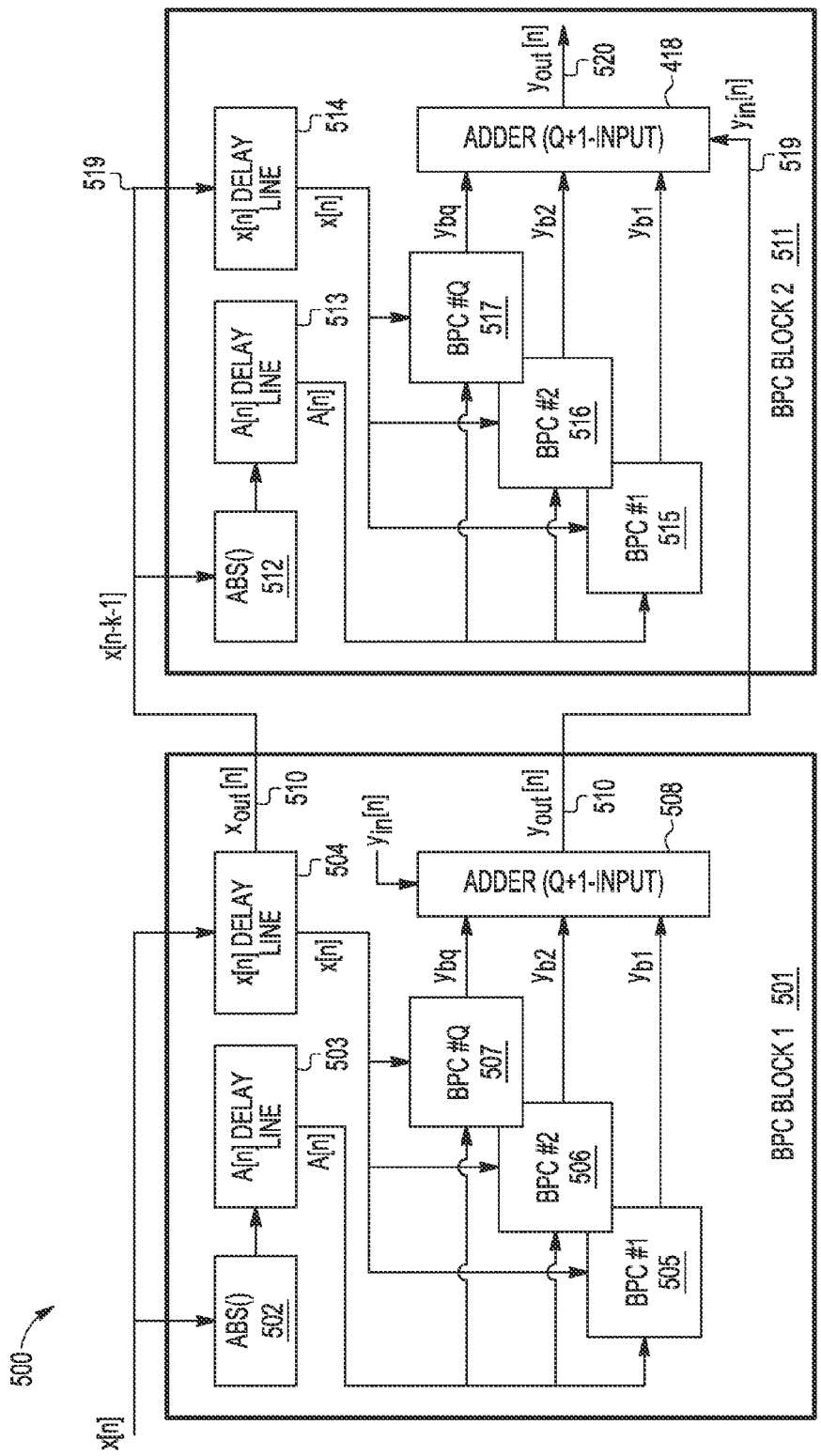
FIG. 7 is a simplified block diagram illustration of two digital predistorter hardware cells which are cascaded by signal delay line concatenation to evaluate higher order Volterra terms in accordance with selected embodiments of the present disclosure.

As will be appreciated, other cascading arrangements may use additional input/output ports $x_{out}[n]$, $y_{in}[n]$ to achieve higher order Volterra terms in accordance with selected embodiments of the present disclosure. For example, reference is now made to FIG. 7 which shows a simplified block diagram illustration of a cascaded circuit 500 having two digital basic predistorter cell (BPC) blocks 501, 511 which are connected using a signal delay line concatenation whereby the first BPC block 501 receives the input complex sample x[n], while the second BPC block 511 receives a delayed version of the input complex sample x[n] provided by the second delay line 504 in the first BPC block 501. In addition, both BPC blocks 501, 511 include adder circuits 508, 518 connected in an adder expansion configuration so that an output term $y_{out}[n]$ from the adder circuit 508 is provided as an input $y_{in}[n]$ to the Q+1 adder circuit 518. Connected in essentially the same arrangement as the cascaded circuit 400 shown in FIG. 6, each BPC block 501, 511 includes a first vector magnitude computation unit 502, 512, a first delay line 503, 513, a second delay line 504, 514, a plurality Q identical basic predistorter cells 505-507, 515-517, and a shared output adder circuit 508, 518 connected as shown. In addition, the BPC blocks 501, 511 also include additional circuitry and connection ports for conveying inputs and/or outputs to or from other BPC blocks. In particular, the first BPC block 501 includes an output connection line or port 510 from the second delay line 504 for providing an output term $x_{out}[n]=x[n-K-1]$ for direct input to an input connection line or port 519 at the second delay line 514 of the second BPC block 511. Again, the shared Q-input adder circuits 508, 518 may both be implemented as Q+1 adder circuits if desired. In any case, the configuration of the depicted cascaded circuit 500 uses the concatenated signal delay lines 504, 515 to generate an output 520 $y_{out}[n]$ from the BPC block 511 that doubles the number and memory span of the Volterra terms.

Figure 8:
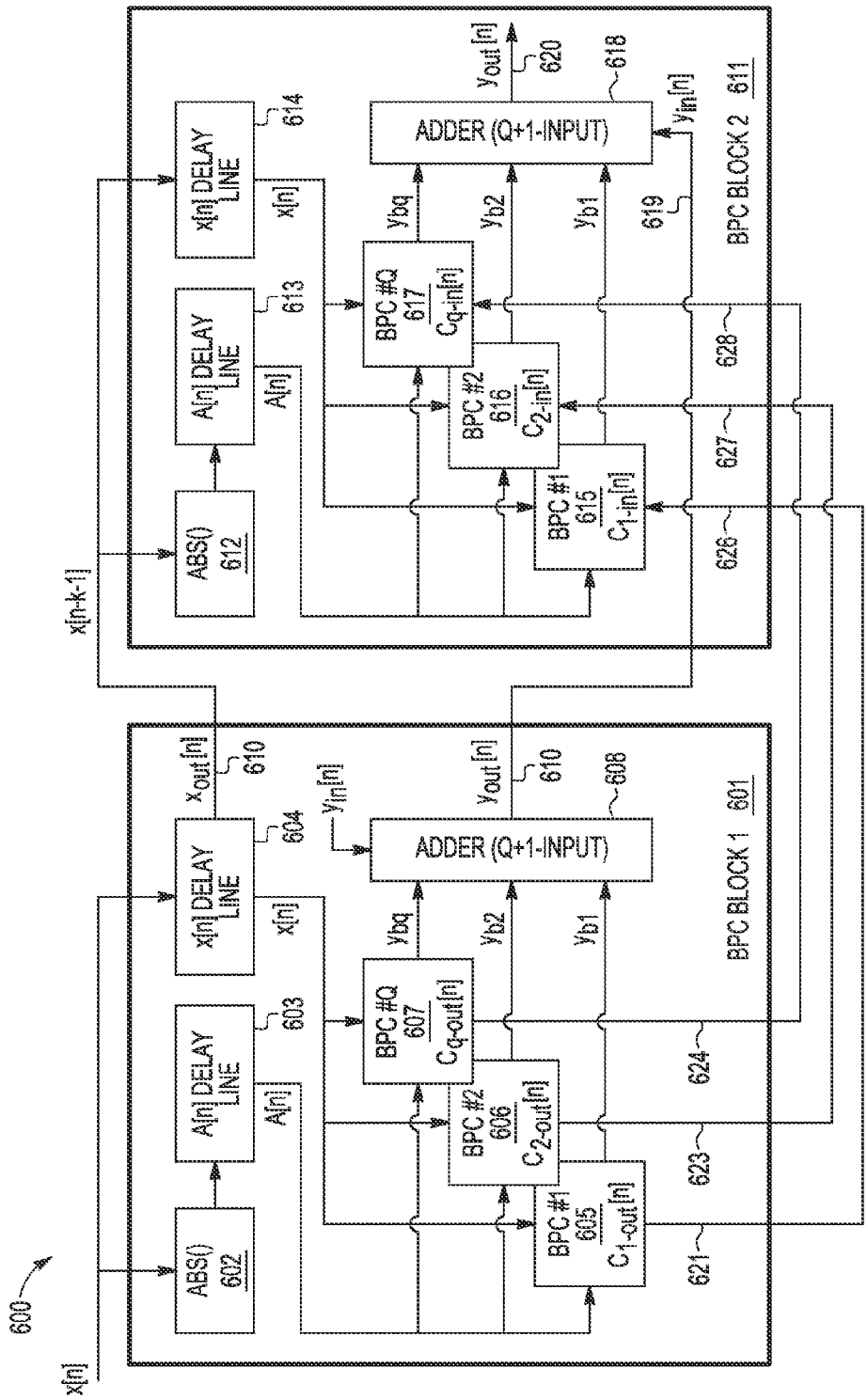
FIG. 8 is a simplified block diagram illustration of two digital predistorter hardware cells which are cascaded by extension ports and signal delay lines to evaluate higher order Volterra terms in accordance with selected embodiments of the present disclosure.

With yet other cascading arrangements, the BPC blocks may be connected with additional input/output ports $x_{out}[n]$, $y_{in}[n]$, $C_{out}[n]$, $C_{in}[n]$ to achieve higher order Volterra terms in accordance with selected embodiments of the present disclosure. For example, reference is now made to FIG. 8 which shows a simplified block diagram illustration of a cascaded circuit 600 having two digital basic predistorter cell (BPC) blocks 601, 611 which are connected using BPC extension ports so that an output port $C_{out}[n]$ at each BPC in a first BPC block is directly connected to an input port $C_{in}[n]$ of a corresponding BPC in a second BPC block. In addition, the BPC blocks 601, 611 are connected using a signal delay line concatenation arrangement whereby the first BPC block 601 receives the input complex sample x[n], while the second BPC block 611 receives a delayed version of the input complex sample x[n] provided by the second delay line 604 in the first BPC block 601. In addition, both BPC blocks 601, 611 include adder circuits 608, 618 connected in an adder expansion configuration so that an output term $y_{out}[n]$ from the adder circuit 608 is provided as an input $y_{in}[n]$ to the Q+1 adder circuit 618. Connected in essentially the same arrangement as the cascaded circuit 500 shown in FIG. 7, each BPC block 601, 611 includes a first vector magnitude computation unit 602, 612, a first delay line 603, 613, a second delay line 604, 614 (including an output connection line or port 610), a plurality Q identical basic predistorter cells 605-607, 615-617, and a shared output adder circuit 608, 618 (including an input output connection line or port 619) connected as shown. In addition, the BPC blocks 601, 611 also include additional circuitry and connection ports for conveying inputs and/or outputs to or from other BPC blocks. In particular, the first BPC block 601 includes an output connection line or port 621 from BPC #1 605 for providing an output term $C_{1-out}[n]$ for direct input as input term $C_{1-in}[n]$ to an input connection line or port 626 at BPC #1 615 of the second BPC block 611. In similar fashion, the first BPC block 601 includes additional output connection lines or ports 623, 624 from additional BPCs 606, 607 for providing output terms $C_{2-out}[n]$, $C_{3-out}[n]$ for direct input as input terms $C_{2-in}[n]$, $C_{3-in}[n]$ to the input connection lines or ports 627, 628 at BPCs 616, 617 of the second BPC block 611. With the configuration of the depicted cascaded circuit 600, it will be appreciated that the cascading of BPC blocks uses the BPC extension ports and signal delay line to generate an output 620 $y_{out}[n]$ from the BPC block 611 that doubles the number, order, and memory span of the Volterra terms.

Figure 9:
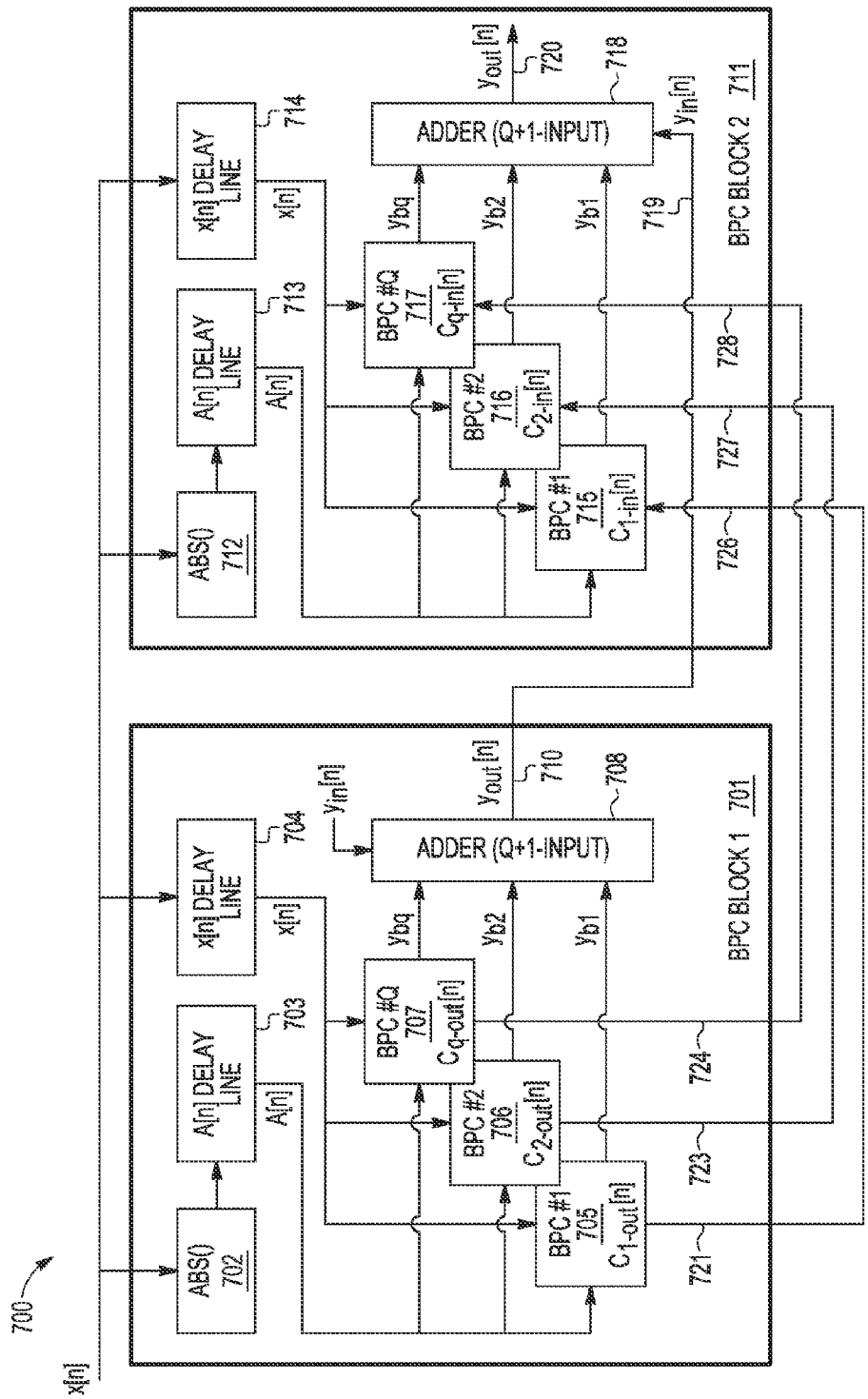
FIG. 9 is a simplified block diagram illustration of two digital predistorter hardware cells which are cascaded by extension ports to evaluate higher order Volterra terms in accordance with selected embodiments of the present disclosure.

In yet another cascading arrangement shown in FIG. 9, the BPC blocks may be connected with additional input/output ports $y_{in}[n]$, $C_{out}[n]$, $C_{in}[n]$ to achieve higher order Volterra terms in accordance with selected embodiments of the present disclosure. As illustrated with the simplified block diagram illustration of a cascaded circuit 700, two digital basic predistorter cell (BPC) blocks 701, 711 may be connected to receive the same input complex sample x[n], and may also be connected together using BPC extension ports so that an output port $C_{out}[n]$ at each BPC in a first BPC block

701 is directly connected to an input port $C_{in}[n]$ of a corresponding BPC in a second BPC block 711. In addition, both BPC blocks 701, 711 include adder circuits 708, 718 connected in an adder expansion configuration so that an output term $y_{out}[n]$ from the adder circuit 708 is provided as an input $y_{in}[n]$ to the Q+1 adder circuit 718. Connected in essentially the same arrangement as the cascaded circuit 600 shown in FIG. 8 except for the shared input complex sample x[n], each BPC block 701, 711 includes a first vector magnitude computation unit 702, 712, a first delay line 703, 713, a second delay line 704, 714, a plurality Q identical basic predistorter cells 705-707, 715-717, and a shared output adder circuit 708, 718 (including an input output connection line or port 719) connected as shown. In addition, the BPC blocks 701, 711 also include additional circuitry and connection ports for conveying inputs and/or outputs to or from other BPC blocks. In particular, the first BPC block 701 includes output connection lines or ports 721-724 at each BPC 705-707 for providing a corresponding output term $C_{1-out}[n]$, $C_{2-out}[n]$, $C_{3-out}[n]$ for direct input as input term $C_{1-in}[n]$, $C_{2-in}[n]$, $C_{3-in}[n]$ to an input connection line or port 726-728 at each BPC 715-717 of the second BPC block 711. With the configuration of the depicted cascaded circuit 700 in which BPC blocks are cascaded using the BPC extension ports, the generated output 720 $y_{out}[n]$ from the BPC block 711 doubles the number and order of the Volterra terms within the delay line time-span. In particular, the multi-port circuit 700 of cascaded BPC blocks 701,711 shown in FIG. 9 can be used to compute the term, $\Sigma\beta_k*X[n-k]^P*\Sigma X[n-l_1]^S*X[n-m_1]*x[n-r_1]$, where the first sum is from k=0:p-1 and the second sum is from r1=0:s-1. As a result, the cascaded BPC blocks can be configured to compute the second order cross term type 3, $\Sigma\Sigma\beta_k*X[n-k]^P*X[n-l_1]^S*X[n-m_1]*x[n-r_1]$.

As described hereinabove, selected embodiments of the digital predistortion hardware 225, 300 disclosed herein may use one or more basic predistorter cells configured in various arrangements to compute not only static and memory polynomial terms and basic cross terms (e.g., cross term type 1), but also higher order Volterra terms (e.g., cross terms type 2 and 3). For example, a single basic predistorter hardware cell unit (e.g., 301) may use a static look-up table ($LUT_{STAT}$) 368 to provide the static pre-equalizing filtering coefficients $S_p$ to evaluate a static or memory-less Volterra series term $Y_s[n]$ from the input complex sample X[n]:

$$Y_S[n] = \sum_{p=1}^P S_p |X[n]|^{p-1} X[n] = LUT_{STAT}(|X[n]|)X[n]$$

In addition, a single basic predistorter hardware cell unit (e.g., 301) may use a memory look-up table ($LUT_{MEM}$) 368 to provide the dynamic pre-equalizing filtering coefficients $M_{qp}$ to evaluate one or more memory polynomial Volterra series terms $Y_M[n]$ from the input complex sample X[n]:

$$Y_M[n] =$$
$$\sum_{q=1}^Q \sum_{p=1}^P M_{qp}|X[n-q]|^{p-1} X[n-q] = \sum_{q=1}^Q LUT_{MEM}(q, |X[n-q]|)X[n-q]$$

Finally, one or more cascaded basic predistorter hardware cell units (e.g., 400, 500, 600, 700) may use cross-term look-up tables ($LUT_{CROSS1}$, $LUT_{CROSS2}$, $LUT_{CROSS3}$) to provide the dynamic pre-equalizing filtering coefficients $C_{qp}$, $C_{qrp}$ to evaluate one or more dynamic memory cross-terms $Y_{C1}[n]$, $Y_{C2}[n]$, $Y_{C3}[n]$ from the input complex sample X[n]:

$$Y_{C1}[n] = \sum_{q=1}^Q \sum_{p=1}^P C_{qp}|X[n]|^P X[n-q] = \sum_{q=1}^Q LUT_{CROSS1}(q, |X[n]|)X[n-q]$$

$$Y_{C2}[n] = \sum_{q=1}^Q \sum_{r=1}^q \sum_{p=1}^P C_{qrp}|X[n]|^P |X[n-r]|X[n-q] = \sum_{q=1}^Q LUT_{CROSS2}$$
$$(q, |X[n]|)|X[n-r]|X[n-q]$$

$$Y_{C3}[n] = \sum_{q=1}^Q \sum_{r=1}^q \sum_{p=1}^P C_{qrp}|X[n]|^P |X[n-s]|^P |X[n-r]|X[n-q]$$
$$= \sum_{q=1}^Q LUT_{CROSS3}(s, q, |X[n]|)|X[n-r]|X[n-q]$$

Figure 10:
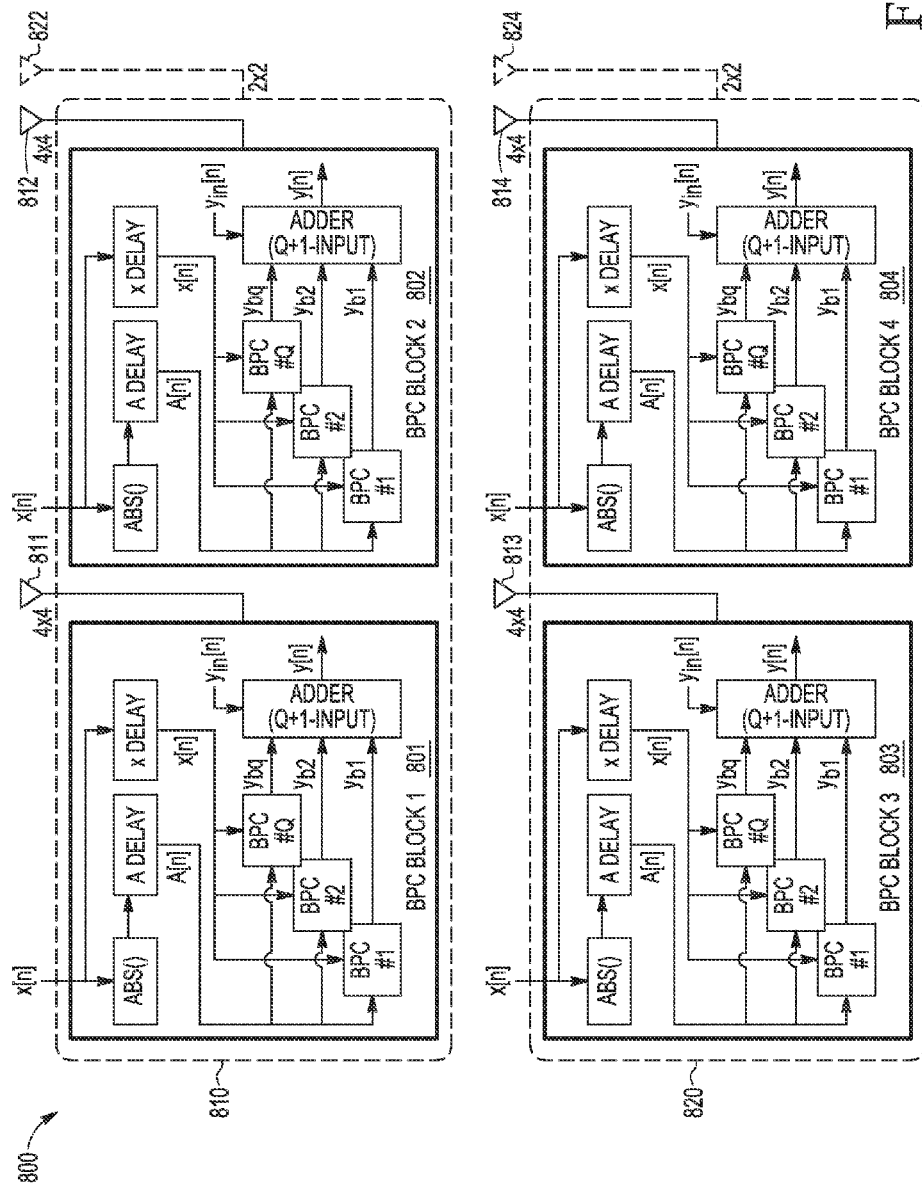
FIG. 10 is a simplified block diagram illustration of a digital front end (DFE) having four digital predistorter hardware cell blocks which may be configured in different bandwidth modes in accordance with selected embodiments of the present disclosure.

As described herein, the DPD module 225 may include a plurality of N BPC blocks (e.g., 401, 411) (where N=4, 8 or larger) which are configurable to support a multi-antenna array 253-255 in different bandwidth modes. To illustrate an example configuration, reference is now made to FIG. 10 which shows a simplified block diagram illustration of a 4×4 digital front end (DFE) 800 having four digital predistorter hardware cell blocks 801-804 which may be configured in different bandwidth modes in accordance with selected embodiments of the present disclosure. The depicted DFE 800 includes four antennas 811-814, each respectively connected to a corresponding BPC block 801-804. Each of N identical BPC blocks 801-804 may be connected in essentially the same arrangement as the DPD module 300 shown in FIG. 5 to include a first vector magnitude computation unit (ABS()), a first delay line (A DELAY), a second delay line (x DELAY), a plurality Q basic predistorter cells (BPC) (where Q=8, 16 or larger) which include a look-up table (LUT) and associated multi-stage multiply and accumulate hardware, and a shared output adder circuit (ADDER) connected as shown. With this arrangement, the DFE 800 is configurable to support different bandwidth modes, including a first 4×4 DFE configuration for a lower-bandwidth mode wherein the N BPC blocks are each configured to separately linearize one of the four transmit antennas 811-814, and a second 2×2 DFE configuration for a higher-bandwidth mode wherein the N BPC blocks are configured into two groups 810, 820 to transmit on two antennas 822, 824, thereby providing a higher-order and higher-complexity solution. Stated more generally, N BPC blocks can be mapped to the maximum number of transmit antennas, or simultaneously approximated nonlinear functions in general, that are supported in parallel by the DFE 800. And with each BPC block including Q BPCs, it will be appreciated that Q can define the minimum complexity of a linearization function per antenna, or of a nonlinear function approximation in general, that is computed in parallel. However, in other applications, the BPCs may not be associated with antennas, but other types of information channels.

Figure 11:
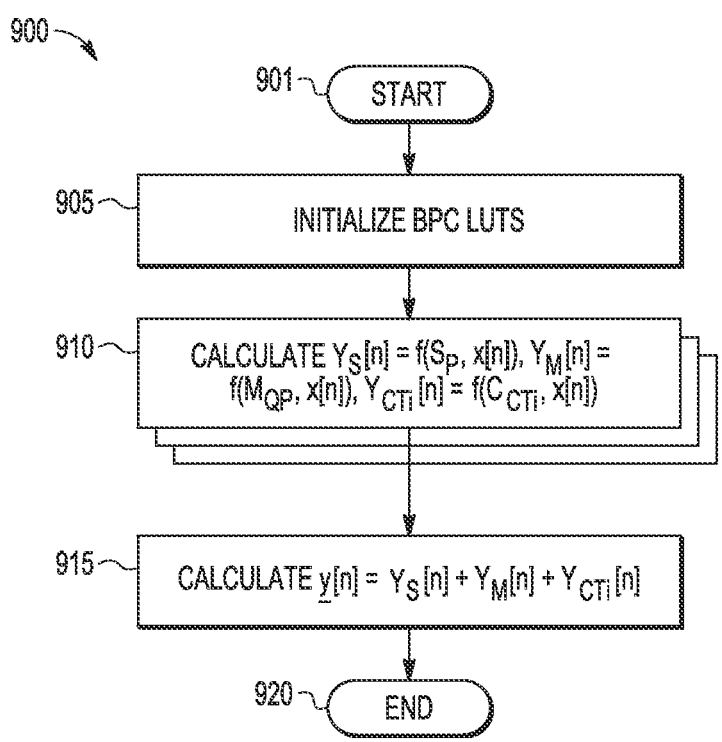
FIG. 11 shows an example flow diagram of a method for computing polynomial values using digital predistortion hardware with a plurality of LUT-based basic predistorter cells to perform Volterra algorithm evaluation of the polynomial.

Referring now to FIG. 11, there is depicted an example flow diagram 900 of a method for computing polynomial values using digital predistortion hardware to perform Volterra algorithm evaluation of the polynomial in accordance with selected embodiments of the present disclosure. In the flow diagram 900, the method steps may be performed with a plurality of LUT-based basic predistorter cells (BPC) having a plurality of multiply/multiplex stages with cascading input/output ports which are controlled by control logic (e.g., at the DFE). The disclosed methods provide a reduced footprint, high throughput, power efficient mechanism for processing absolute or magnitude values from a complex input vector and complex polynomial coefficient values to evaluate the complex polynomial against the complex input vector, such as by finding the root(s) of the complex polynomial using Volterra's method.

Once the method starts at step 901, look-up tables at each BPC are initialized or loaded at step 905 with input values for computation of the desired Volterra terms. For example, one or more first BPCs are loaded with a static look-up table ($LUT_{MEM}$) that is used to evaluate one or more static or memory-less Volterra series terms $Y_S[n]$. In addition, one or more second BPCs are loaded with a memory look-up table ($LUT_{MEM}$) that is used to evaluate one or more memory polynomial Volterra series terms $Y_M[n]$. Finally, one or more cascaded BPCs are loaded with cross-term look-up tables ($LUT_{CROSS1}$, $LUT_{CROSS2}$, $LUT_{CROSS3}$) to provide the dynamic pre-equalizing filtering coefficients $C_{qp}$, $C_{qrp}$ to dynamic memory cross-terms $Y_{C1}[n]$, $Y_{C2}[n]$, $Y_{C3}[n]$.

Once initialization is finished, the individual Volterra series terms are calculated at step 910. At this point, the digital predistortion hardware uses the plurality of LUT-based BPCs connected on various cascade arrangements to compute not only static polynomial terms $Y_S[n]$ and memory polynomial terms $Y_M[n]$ but also higher order cross-terms, including first and second order dynamic memory cross-terms $Y_{C1}[n]$, $Y_{C2}[n]$, $Y_{C3}[n]$. For example, a static polynomial term $Y_S[n]$ may be calculated at a first BPC as a function of the static pre-equalizing filtering coefficients $S_p$ and input complex sample values $x[n]$, while a memory polynomial term $Y_M[n]$ may be calculated at a second BPC as a function of the dynamic pre-equalizing filtering coefficients $M_{qp}$ and input complex sample values $x[n]$. In addition, one or more cross-terms— such as type 1 cross-term $Y_{CT1}[n]$, type 2 cross-terms $Y_{CT2}[n]$, or type 3 cross-term $Y_{CT3}[n]$—may be calculated at one or more cascaded BPCs as a function of the dynamic pre-equalizing filtering coefficients $C_{CT}$ and input complex sample values $x[n]$.

As a final step 915, the digital predistortion hardware calculates the complex sum $y[n]$ by adding the individual Volterra series terms computed at step 910. In this way, the digital predistortion hardware operates in parallel to calculate individual Volterra terms with pipelining of the BPC operations to simultaneously evaluate a complex polynomial against different values from a complex input vector. At step 920, the method ends.

As disclosed herein, the system, apparatus, and methodology for evaluating a polynomial with a flexible high performance digital predistortion hardware provides a flexible hardware approach for performing pre-correction processing by cascading DPD actuators to compute Volterra series memory polynomial terms and cross terms of type 1, 2 and 3 based on look-up table (LUT) implementation in single memory. By adding the computed Volterra terms, higher performance can be achieved with the same power amplifier hardware (i.e., lower adjacent channel power carrier leakage and higher output power efficiency). However, it will be appreciated that the disclosed arrangement of LUT-based basic predistorter cells connected and/or cascaded via enhanced input/output ports may also be used for general purpose mathematical approximation and modeling of nonlinear processes, and not just evaluation of Volterra series terms. Thus, the description provided herein with reference to a digital front end circuit having DPD processing is provided as an example embodiment, and it will be appreciated that the embodiments disclosed herein relate more broadly to an adaptive high-order nonlinear function approximation using time-domain Volterra series. Thus, other complex multi-purpose non-linear function structures may be implemented to provide different types of Volterra series implementations and selectable orders of approximation, such as memory polynomials, Volterra-series terms with dynamic deviation reduction, cross-term polynomials, generalized memory polynomials, etc.). In addition, the disclosed arrangement of multiple BPC blocks enables a scalable number of channels to be supported by computing different nonlinear functions in parallel at the multiple BPC blocks, thereby. increasing throughput and efficiency. The inclusion of look-up tables in each basic predistorter cell also enables real-time programmability and configuration of the nonlinear functions provided by the digital predistortion hardware so that the definition and structural operation of the hardware may be changed on demand. For example, as an application needs more complex approximation, the additional BPCs may be engaged. The BPC hardware is also suitable for high-speed and computationally intensive SoC applications. The BPC structure provides design opportunities for high frequency clocking. The design can be implemented as optimized and hardened core, which is later used in application-specific SoC realizations with customized interconnect in the upper levels of the layout hierarchy.

As will be appreciated, the disclosed mechanism, system and methodology described herein for using a digital predistortion hardware with cascaded LUT-based basic predistorter cells to efficiently evaluate complex polynomials against a complex input vector may be embodied in hardware as a plurality of multiply/multiplex stages with storage flop devices for holding intermediate computation results for different complex input vector values. However, selected aspects of the digital predistortion hardware functionality may be programmed or loaded by processing circuitry (e.g., a field-programmable gate array) executing software (e.g., in a processor or a controller including but not limited to firmware, resident software, microcode, etc.). Any such programming operation may be embodied in whole or in part as a computer program product accessible from a computer-usable or computer-readable medium providing program code for use by or in connection with a computer or any instruction execution system, where a computer-usable or computer readable medium can be any apparatus that may include, store, communicate, propagate, or transport the program for use by or in connection with the instruction execution system, apparatus, or device. Examples of a computer-readable medium include a semiconductor or solid state memory, magnetic tape, a removable computer diskette, a random access memory (RAM), a read-only memory (ROM), a rigid magnetic disk, USB memory stick, and an optical disk, such as a compact disk-read only memory (CD-ROM), compact disk-read/write (CD-R/W), DVD, and the like.

By now it should be appreciated that there has been provided a circuit, method and system for predistorting an input signal to compensate for non-linearities of an electronic device that operates on the input signal to produce an output signal, such as may be used by performing digital pre-distortion in a base station having a radio frequency (RF) communication signal path and transceiver front end. In the disclosed methodology, there is provided an input for receiving a first input signal as a plurality of signal samples $x[n]$ to be transmitted over a non-linear element. In selected embodiments, the input may be connected to receive the first input signal as IQ baseband input signal samples from the baseband modem. In other embodiments, the input may be provided through a multiplexer for selecting between the first input signal and a second input signal of a plurality of delayed signal samples $x_{in}[n]$. In addition, there is provided one or more digital predistortion blocks coupled to the input and generating an output signal y[n] by adaptively modifying the first input signal to compensate for distortion effects in the non-linear element. To this end, each digital predistortion block includes a first delay line, a second delay line, a plurality of Q predistorter cells, and an output adder circuit. The first delay line stores a first plurality of signal samples x[n], while the second delay line stores a first plurality of amplitude samples A[n] derived from the first plurality of signal samples x[n]. For example, the first delay line may hold K complex signal samples, while the second delay line may hold K absolute values of the K complex signal samples. In selected embodiments, the first delay line includes an expansion output port for providing a delayed first plurality of signal samples x[n] to another another digital predistortion block. In addition, each of the Q predistorter cells includes an input stage for combining amplitude samples received from the second delay line into a first stage output, a lookup table (LUT) connected to be addressed by the first stage output for generating an LUT output, and one or more output multiplication stages for combining the LUT output with signal samples and amplitude samples received from the first and second delay lines to generate an output signal sample $y_Q$ from said predistorter cell. In predistorter cell, the LUT may be initialized by programmably storing LUT entries with polynomial filtering coefficients so that the LUT provides linear interpolation between LUT entries. In addition, each predistorter cell may include first and second input multiplexers coupled to provide first and second amplitude samples from the second delay line; a first multiplier circuit and a first input stage multiplexer forming the input stage, where the first multiplier circuit is connected to combine the first and second amplitude samples into a first product output which is supplied with the first amplitude sample value to the first input stage multiplexer which generates the first stage output; a second multiplier circuit, second stage input multiplexer, and second stage multiplexer forming a first output multiplication stage, where the second multiplier circuit is connected to combine the LUT output with amplitude samples from the second delay line provided by the second stage input multiplexer into a second product output which is supplied with the LUT output to the second stage multiplexer which generates the second stage output; and a third multiplier circuit, third stage input multiplexer, and third stage multiplexer forming a second output multiplication stage, where the third multiplier circuit is connected to combine the second product output with signal samples from the first delay line provided by the third stage input multiplexer into a third product output which is supplied with an empty term to the third stage multiplexer which generates the output signal sample $y_Q$. In the second stage input multiplexer, an expansion input port is provided for receiving an input signal Cin from another predistorter cell. In addition, the second stage multiplexer may include an expansion output port for providing an output signal Cout to another predistorter cell. The output adder circuit is connected to combine the output signal samples $y_Q$ from the plurality of Q predistorter cells into a combined signal. In selected embodiments, the output adder circuit may include an expansion input port for receiving a combined signal from another digital predistortion block. The combined signal is processed to generate the output signal y[n] for transmission to the non-linear element. In this configuration, a first digital predistortion block may be configured to generate one or more static Volterra polynomial terms, a second digital predistortion block may be configured to generate one or more dynamic Volterra memory polynomial terms, a third digital predistortion block may be configured to generate one or more type 1 Volterra cross-terms, and one or more fourth digital predistortion blocks may be configured to generate one or more type 2 or type 3 Volterra cross-terms. For example, the fourth digital predistortion blocks may be provided as plurality of cascaded digital predistortion blocks which are connected together and configured to generate second order type 2 or type 3 Volterra cross-terms.

In another form, there is provided a circuit for predistorting a signal according to Volterra Series Approximation Model for transmission over a non-linear element, where the circuit includes a first digital predistortion block and a second digital predistortion block which are connected in a cascaded arrangement to produce a type 2 or type 3 Volterra series cross term. The first predistortion block includes a first sample delay line for storing a plurality of first input signal samples $x_1[n]$; a first vector magnitude computation unit for computing a plurality of first amplitude samples $A_1[n]$ derived from the plurality of first signal samples $x_1[n]$; a first amplitude sample delay line for storing the plurality of first amplitude samples $A_1[n]$; a first plurality of predistorter cells, each including an first input stage for combining amplitude samples received from the first amplitude sample delay line into a first stage output, a first lookup table (LUT) connected to be addressed by the first stage output for generating a first LUT output, and one or more first output multiplication stages for combining the first LUT output with signal samples and amplitude samples received from the first sample delay line and first amplitude sample delay line to generate a first output signal sample $y_Q$ from said predistorter cell; and a first output adder circuit connected to combine the first output signal samples $y^{Q1}$ from the first plurality of predistorter cells into a first combined signal. In addition, the second digital predistortion block includes a second sample delay line for storing a plurality of second input signal samples $x_2[n]$; a second vector magnitude computation unit for computing a plurality of second amplitude samples $A_2[n]$ derived from the plurality of second signal samples $x_2[n]$; a second amplitude sample delay line for storing the plurality of second amplitude samples $A_2[n]$; a second plurality of predistorter cells, each including an second input stage for combining amplitude samples received from the second amplitude sample delay line into a second stage output, a second lookup table (LUT) connected to be addressed by the second stage output for generating a second LUT output, and one or more second output multiplication stages for combining the second LUT output with signal samples and amplitude samples received from the second sample delay line and second amplitude sample delay line to generate a second output signal sample $y_{Q2}$ from said predistorter cell; and a second output adder circuit connected to combine the second output signal samples $y_{Q2}$ from the second plurality of predistorter cells into a second combined signal. In selected embodiments, the second digital predistortion block is connected to receive the plurality of first input signal samples $x_1[n]$ as the plurality of second input signal samples $x_2[n]$, and the second output adder circuit includes an additional input port connected to receive the first combined signal from the first digital predistortion block. In other embodiments, the first sample delay line includes an output connection port for providing delayed versions of the plurality of first input signal samples $x_1[n]$ to the second digital predistortion block as the plurality of second input signal samples $x_2[n]$, and the second output adder circuit includes an additional input port connected to receive the first combined signal from the first digital predistortion block. In addition, each of the first plurality of predistorter cells may include an output connection port for providing an output signal from the one or more first output multiplication stages to a corresponding one of the second plurality of predistorter cells as an input signal. In yet other embodiments, the second digital predistortion block is connected to receive the plurality of first input signal samples $x_1[n]$ as the plurality of second input signal samples $x_2[n]$, the second output adder circuit includes an additional input port connected to receive the first combined signal from the first digital predistortion block, and each of the first plurality of predistorter cells includes an output connection port for providing an output signal from the one or more first output multiplication stages to a corresponding one of the second plurality of predistorter cells as an input signal.

In yet another form, the circuit for predistorting a signal according to Volterra Series Approximation Model for transmission over a non-linear element also includes a third predistortion block including a third sample delay line for storing a plurality of third input signal samples $x_3[n]$; a third vector magnitude computation unit for computing a plurality of third amplitude samples $A_3[n]$ derived from the plurality of third signal samples $x_3[n]$; a third amplitude sample delay line for storing the plurality of third amplitude samples $A_3[n]$; a third plurality of predistorter cells, each including a third input stage for combining amplitude samples received from the third amplitude sample delay line into a third stage output, a third lookup table (LUT) connected to be addressed by the third stage output for generating a third LUT output, and one or more third output multiplication stages for combining the third LUT output with signal samples and amplitude samples received from the third sample delay line and third amplitude sample delay line to generate a third output signal sample $y_{Q3}$ from said predistorter cell; and a third output adder circuit connected to combine the third output signal samples $y_{Q3}$ from the third plurality of predistorter cells into a third combined signal, where the first, second, and third digital predistortion blocks are connected in a cascaded arrangement to produce a type 2 or type 3 Volterra series cross term.

Although the described exemplary embodiments disclosed herein are directed to hardware-based methods and systems for efficiently evaluating higher order Volterra series terms, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Various illustrative embodiments of the present invention will now be described in detail below with reference to the figures.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus

What is claimed is:

1. A method for predistorting an input signal to compensate for non-linearities of an electronic device that operates on the input signal to produce an output signal, comprising:
   providing an input circuit for receiving, a first input signal as a plurality of signal samples x[n] to be transmitted through a non-linear element;
   providing one or more digital predistortion blocks coupled to the input circuit and generating an output signal y[n] by adaptively modifying the first input signal to compensate for distortion effects in the non-linear element, each of the one or more digital predistortion blocks comprising:
     a first delay line for storing a first plurality of signal samples x[n];
     a second delay line for storing a first plurality of amplitude samples A[n] derived from the first plurality of signal samples x[n];
     a plurality of Q predistorter cells, each respectively comprising an input stage multiplier and a plurality of multiplexers for combining amplitude samples received from the second delay line into a first stage output, a lookup table (LUT) connected to be addressed by the first stage output for generating an LUT output, and one or more output multiplication stages for combining the LUT output with signal samples and amplitude samples received from the first and second delay lines to generate an output signal sample $y_Q$ from each of said predistorter cells; and
     an output adder circuit connected to combine the output signal samples $y_Q$ from each of the plurality of Q predistorter cells into a combined signal; and
   processing the combined signal to generate the output signal y[n] for transmission to the non-linear element.

2. The method of claim 1, further comprising connecting the input circuit to receive the first input signal as IQ baseband input signal samples from a baseband modem.

3. The method of claim 1, where the first delay line holds K complex signal samples.

4. The method of claim 1, where the second delay line holds K absolute values of the K complex signal samples.

5. The method of claim 1, further comprising initializing each of the LUTs by programmably storing LUT entries with polynomial filtering coefficients.

6. The method of claim 1, where each of the LUTs provides linear interpolation between LUT entries.

7. The method of claim 1, where each of the plurality of Q predistorter cells, further comprises:
   first and second input multiplexers, of the plurality of multiplexers, coupled to respectively provide first and second amplitude samples from the second delay line;
   a first multiplier circuit connected to combine the first and second amplitude samples into a first product output which is supplied with the first amplitude sample value to a third multiplexer, of the plurality of multiplexers, which generates the first stage output;
   a second multiplier circuit, second stage input multiplexer, and second stage multiplexer forming a first output multiplication stage, where the second multiplier circuit is connected to combine the LUT output with amplitude samples from the second delay line provided by the second stage input multiplexer into a second product output which is supplied with the LUT output to the second stage multiplexer which generates the second stage output; and
   a third multiplier circuit, third stage input multiplexer, and third stage multiplexer forming a second output multiplication stage, where the third multiplier circuit is connected to combine the second product output with signal samples from the first delay line provided by the third stage input multiplexer into a third product output which is supplied with an empty term to the third stage multiplexer which generates the respective output signal sample $y_Q$.

8. The method of claim 7, where the second stage input multiplexer comprises an expansion input port for receiving an input signal Cin from another predistorter cell.

9. The method of claim 8, further comprising an expansion output port from the second stage multiplexer for providing an output signal Cout to another predistorter cell.

10. The method of claim 1, where the output adder circuit comprises an expansion input port for receiving a combined signal from another digital predistortion block.

11. The method of claim 1, where the first delay line comprises an expansion output port for providing a delayed first plurality of signal samples x[n] to another another digital predistortion block.

12. The method of claim 1, where providing the one or more digital predistortion blocks further comprises:
   providing a first digital predistortion block configured to generate one or more static Volterra polynomial terms;
   providing a second digital predistortion block configured to generate one or more dynamic Volterra memory polynomial terms;
   providing a third digital predistortion block configured to generate one or more type 1 Volterra cross-terms; and
   providing one or more fourth digital predistortion blocks configured to generate one or more type 2 or type 3 Volterra cross-terms.

13. The method of claim 12, where providing the one or more fourth digital predistortion blocks further comprises providing a plurality of cascaded digital predistortion blocks which are connected together and configured to generate second order type 2 or type 3 Volterra cross-terms.

14. The method of claim 1, where providing the input circuit comprises providing a multiplexer for selecting between the first input signal and a second input signal of a plurality of delayed signal samples $x_{in}[n]$.

15. A circuit for predistorting a signal according to Volterra Series Approximation Model for transmission over a non-linear element, comprising:
   a first digital predistortion block comprising:
      a first sample delay line for storing a plurality of first input signal samples $x_1[n]$;
      a first vector magnitude computation unit for computing a plurality of first amplitude samples $A_1[n]$ derived from the plurality of first signal samples $x_1[n]$;
      a first amplitude sample delay line for storing the plurality of first amplitude samples $A_1[n]$;
      a first plurality of predistorter cells, each comprising: a first input stage for combining amplitude samples received from the first amplitude sample delay line into a first stage output, a first lookup table (LUT) connected to be addressed by the first stage output for generating a first LUT output, and one or more first output multiplication stages for combining the first LUT output with signal samples and amplitude samples received from the first sample delay line and first amplitude sample delay line to generate a first output signal sample $y_Q$ from said respective predistorter cell; and
      a first output adder circuit connected to combine the first output signal samples $y_{Q1}$ from the first plurality of predistorter cells into a first combined signal; and
   a second digital predistortion block comprising:
      a second sample delay line for storing a plurality of second input signal samples $x_2[n]$;
      a second vector magnitude computation unit for computing a plurality of second amplitude samples $A_2[n]$ derived from the plurality of second signal samples $x_2[n]$;
      a second amplitude sample delay line for storing the plurality of second amplitude samples $A_2[n]$;
      a second plurality of predistorter cells, each comprising: a second input stage for combining amplitude samples received from the second amplitude sample delay line into a second stage output, a second lookup table (LUT) connected to be addressed by the second stage output for generating a second LUT output, and one or more second output multiplication stages for combining the second LUT output with signal samples and amplitude samples received from the second sample delay line and second amplitude sample delay line to generate a second output signal sample $y_{Q2}$ from said respective predistorter cell; and
      a second output adder circuit connected to combine the second output signal samples $y_{Q2}$ from the second plurality of predistorter cells into a second combined signal;
   where the first and second digital predistortion blocks are connected in a cascaded arrangement to produce a type 2 or type 3 Volterra series cross term.

16. The circuit of claim 15, wherein the second digital predistortion block is connected to receive the plurality of first input signal samples $x_1[n]$ as the plurality of second input signal samples $x_2[n]$, and wherein the second output adder circuit comprises an additional input port connected to receive the first combined signal from the first digital predistortion block.

17. The circuit of claim 15, wherein the first sample delay line comprises an output connection port for providing delayed versions of the plurality of first input signal samples $x_1[n]$ to the second digital predistortion block as the plurality of second input signal samples $x_2[n]$, and wherein the second output adder circuit comprises an additional input port connected to receive the first combined signal from the first digital predistortion block.

18. The circuit of claim 17, wherein each of the first plurality of predisorter cells comprises an output connection port for providing an output signal from the one or more first output multiplication stages to a corresponding one of the second plurality of predisorter cells as an input signal.

19. The circuit of claim 15, wherein the second digital predistortion block is connected to receive the plurality of first input signal samples $x_1[n]$ as the plurality of second input signal samples $x_2[n]$, wherein the second output adder circuit comprises an additional input port connected to receive the first combined signal from the first digital predistortion block, and wherein each of the first plurality of predisorter cells comprises an output connection port for providing an output signal from the one or more first output multiplication stages to a corresponding one of the second plurality of predisorter cells as an input signal.

20. The circuit of claim 15, further comprising
a third digital predistortion block comprising:
    a third sample delay line for storing a plurality of third input signal samples $x_3[n]$;
    a third vector magnitude computation unit for computing a plurality of third amplitude samples $A_3[n]$ derived from the plurality of third signal samples $x_3[n]$;
    a third amplitude sample delay line for storing the plurality of third amplitude samples $A_3[n]$;
    a third plurality of predisorter cells, each comprising: a third input stage for combining amplitude samples received from the third amplitude sample delay line into a third stage output, a third lookup table (LUT) connected to be addressed by the third stage output for generating a third LUT output, and one or more third output multiplication stages for combining the third LUT output with signal samples and amplitude samples received from the third sample delay line and third amplitude sample delay line to generate a third output signal sample $y_{Q3}$ from said respective predisorter cell; and
    a third output adder circuit connected to combine the third output signal samples $y_{Q3}$ from the third plurality of predisorter cells into a third combined signal;
where the first, second, and third digital predistortion blocks are connected in a cascaded arrangement to produce a type 2 or type 3 Volterra series cross term.

* * * * *

UNITED STATES PATENT AND TRADEMARK OFFICE
CERTIFICATE OF CORRECTION

PATENT NO.       : 9,252,821 B2                                    Page 1 of 1
APPLICATION NO.  : 14/318000
DATED            : February 2, 2016
INVENTOR(S)      : Roi M. Shor et al.

It is certified that error appears in the above-identified patent and that said Letters Patent is hereby corrected as shown below:

In the Claims

Claim 11, Col. 21, line 45, should read "plurality of signal samples x[n] to another digital"

Signed and Sealed this
Third Day of May, 2016

Michelle K. Lee
*Director of the United States Patent and Trademark Office*